(12) United States Patent
Sandstrom et al.

(10) Patent No.: US 6,556,600 B2
(45) Date of Patent: *Apr. 29, 2003

(54) INJECTION SEEDED F$_2$ LASER WITH CENTERLINE WAVELENGTH CONTROL

(75) Inventors: Richard L. Sandstrom, Encinitas, CA (US); Richard M. Ness, San Diego, CA (US); William N. Partlo, Poway, CA (US); Alexander I. Ershov, San Diego, CA (US); Eckehard D. Onkels, San Diego, CA (US); Choonghoon Oh, Temecula, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/855,310

(22) Filed: May 14, 2001

(65) Prior Publication Data

US 2002/0186739 A1 Dec. 12, 2002

Related U.S. Application Data

(63) Continuation-in-part of application No. 09/854,097, filed on May 11, 2001, and a continuation-in-part of application No. 09/848,043, filed on May 3, 2001, and a continuation-in-part of application No. 09/829,475, filed on Apr. 9, 2001, and a continuation-in-part of application No. 09/473,795, filed on Dec. 28, 1999, and a continuation-in-part of application No. 09/459,165, filed on Dec. 10, 1999, and a continuation-in-part of application No. 09/438,249, filed on Nov. 12, 1999, and a continuation-in-part of application No. 09/421,701, filed on Oct. 20, 1999, and a continuation-in-part of application No. 09/407,120, filed on Sep. 27, 1999.

(51) Int. Cl.$^7$ ................................................. H01S 3/10

(52) U.S. Cl. ........................ 372/25; 372/57; 372/38.02; 372/38.07

(58) Field of Search .............................. 372/57–59, 68, 372/25, 87, 38.07, 38.02

(56) References Cited

U.S. PATENT DOCUMENTS

| 3,593,189 A | 7/1971 | Buhrer ....................... 331/94.5 |
| 4,534,035 A | 8/1985 | Long ............................. 372/85 |
| 4,697,270 A | 9/1987 | Galkowski ................... 372/34 |
| 4,798,467 A | 1/1989 | Wyeth et al. ............... 356/349 |

(List continued on next page.)

OTHER PUBLICATIONS

Balla and Hart, "Spectral brightness and other improvements to the tunable ArF excimer laser," *Rev. Sci. Instum.*, vol. 59, No. 7, pp. 2591–2594 (Jul. 1998).

Bollanti et al., "Compact three electrodes excimer laser IANUS for a POPA optical system," In: *High–power gas and sol state lasers; Proceedings of the Meeting, Vienna, Austria, Apr. 5–8, 1994* (A95–2267605–36), Bellingham, WA, Society of Photo–Optical Instrumentation Engineers, SPIE Proceedings, vol. 2206, 1994, pp. 144–153.

(List continued on next page.)

Primary Examiner—Paul Ip
Assistant Examiner—Davienne Monbleau
(74) Attorney, Agent, or Firm—John R. Ross

(57) ABSTRACT

The present invention provides a narrow band laser system having two laser subsystems. The first laser subsystem is configured to provide a very narrow band pulsed output beam which is used to injection seed the second laser subsystem where the narrow band pulsed seed beam is amplified to produce a narrow band pulsed output beam. A pulse power supply is provided which is specially configured to precisely time the discharges in the two laser subsystem so that the discharges are properly synchronized. The laser gas comprises F$_2$ at a partial pressure less than about 1% with a buffer gas comprised of helium or neon or a combination of helium and neon. Control of center wavelength of the output beam is provided by adjusting one or more of the following parameters in the first laser: the total laser gas pressure, the relative concentration of helium or neon, F$_2$ partial pressure, laser gas temperature, discharge voltage and pulse energy.

11 Claims, 37 Drawing Sheets

U.S. PATENT DOCUMENTS

| | | | |
|---|---|---|---|
| 4,817,101 A | 3/1989 | Wyeth et al. | 372/32 |
| 4,940,331 A | 7/1990 | Wyeth et al. | 356/349 |
| 4,959,840 A | 9/1990 | Atkins et al. | 372/57 |
| 5,025,445 A | 6/1991 | Anderson et al. | 372/20 |
| 5,070,513 A | 12/1991 | Letardi | 372/83 |
| 5,095,492 A | 3/1992 | Sandstrom | 372/102 |
| 5,128,601 A | 7/1992 | Orbach et al. | 372/30 |
| 5,142,166 A | 8/1992 | Birx | 307/419 |
| 5,371,587 A | 12/1994 | De Groot et al. | 356/349 |
| 5,420,877 A | 5/1995 | Sandstrom | 372/34 |
| 5,450,207 A | 9/1995 | Fomenkov | 356/416 |
| 5,524,144 A | 6/1996 | Suzuki | 359/176 |
| 5,656,882 A | 8/1997 | Lazarus et al. | 310/328 |
| 5,691,989 A | 11/1997 | Rakuljic | 372/20 |
| 5,706,301 A | 1/1998 | Lagerstrom | 372/32 |
| 5,729,562 A | 3/1998 | Birx et al. | 372/38 |
| 5,754,571 A | 5/1998 | Endoh et al. | 372/20 |
| 5,848,089 A | 12/1998 | Sarkar et al. | 372/58 |
| 5,852,621 A | 12/1998 | Sandstrom | 372/25 |
| 5,856,991 A | 1/1999 | Ershov | 372/57 |
| 5,870,420 A | 2/1999 | Webb | 372/58 |
| 5,970,082 A | 10/1999 | Ershov | 372/102 |
| 5,978,394 A | 11/1999 | Newman et al. | 372/32 |
| 5,978,405 A | 11/1999 | Juhasz et al. | 372/57 |
| 5,991,324 A | 11/1999 | Knowles et al. | 372/57 |
| 6,005,879 A | 12/1999 | Sandstrom et al. | 372/25 |
| 6,016,325 A | 1/2000 | Ness et al. | 372/38 |
| 6,026,103 A | 2/2000 | Oliver et al. | 372/37 |
| 6,034,978 A | 3/2000 | Ujazdowski et al. | 372/34 |
| 6,038,055 A | 3/2000 | Hansch et al. | 359/279 |
| 6,078,599 A | 6/2000 | Everage et al. | 372/20 |
| 6,109,574 A | 8/2000 | Pan et al. | 248/176.1 |
| 6,128,323 A | 10/2000 | Myers et al. | 372/38 |
| 6,151,346 A | 11/2000 | Partlo et al. | 372/38 |
| 6,154,470 A | 11/2000 | Basting et al. | 372/19 |
| 6,192,064 B1 | 2/2001 | Algots et al. | 372/99 |
| 6,359,922 B1 | 3/2002 | Partlo et al. | |
| 6,392,743 B1 | 5/2002 | Zambon et al. | |
| 6,393,040 B1 * | 5/2002 | Govorkov et al. | 372/29.014 |
| 6,404,784 B2 * | 6/2002 | Komine | 372/9 |

OTHER PUBLICATIONS

Bollanti et al., "Ianus, the three–electrode excimer laser," *Applied Physics B* (*Lasers and Optics*), vol B66, No. 4, pp. 401–406, Publisher: Springer–Verlag (Apr. 1998).

Hercher, Michael, "Tunable Single Mode Operation of Gas Lasers Using Intracavity Tilted Etalons," *Applied Optics*, vol. 8, No. 6, Jun. 1969, pp. 1103–1106.

Ishihara, T., et al., "Advanced Krypton Fluoride Excimer Laser for Microlithography," SPIE vol. 1674, Optical/Laser Microlithography V (1992), pp. 473–485.

"Introduction to Signal Condition for ICP ® & Charge Piezoelectric Sensors", from website: www.pcb.com/tech_signal.Html, ©Copyright PCT Piezotronics 1999.

Jenkins, Francis A. and White, Harvey E., "Fundamentals of Optics," McGraw–Hill Book Company, Fourth Edition, Copyright 1957, 1976, pp. 297–299.

Kakehata et al., "Gain and saturation intensity measurements of a discharge pumped $F_2$ laser at high excitation rates," *Appl. Phys. Letter*, 61(26), Dec. 28, 1992.

Kakehata et al., "Output characteristics of a discharge–pumped $F_2$ laser (167 nm) with an injection–seeded unstable resonator," *J. Appl. Phys.* 74 (4), Aug. 15, 1993.

Mueckenhelm et al., "Excimer laser with narrow linewidth and large internal beam divergence," *Journal of Physics E–Scientific Instruments* (ISSN 0022–3735), vol. 20, Nov. 1987, pp. 1394–1396 (Nov. 1987).

Reintjes, John F., "Laser Handbook," *Elsevier Science Publishers, B.V.*, 1985 (vol. 5) pp. 44–50.

* cited by examiner

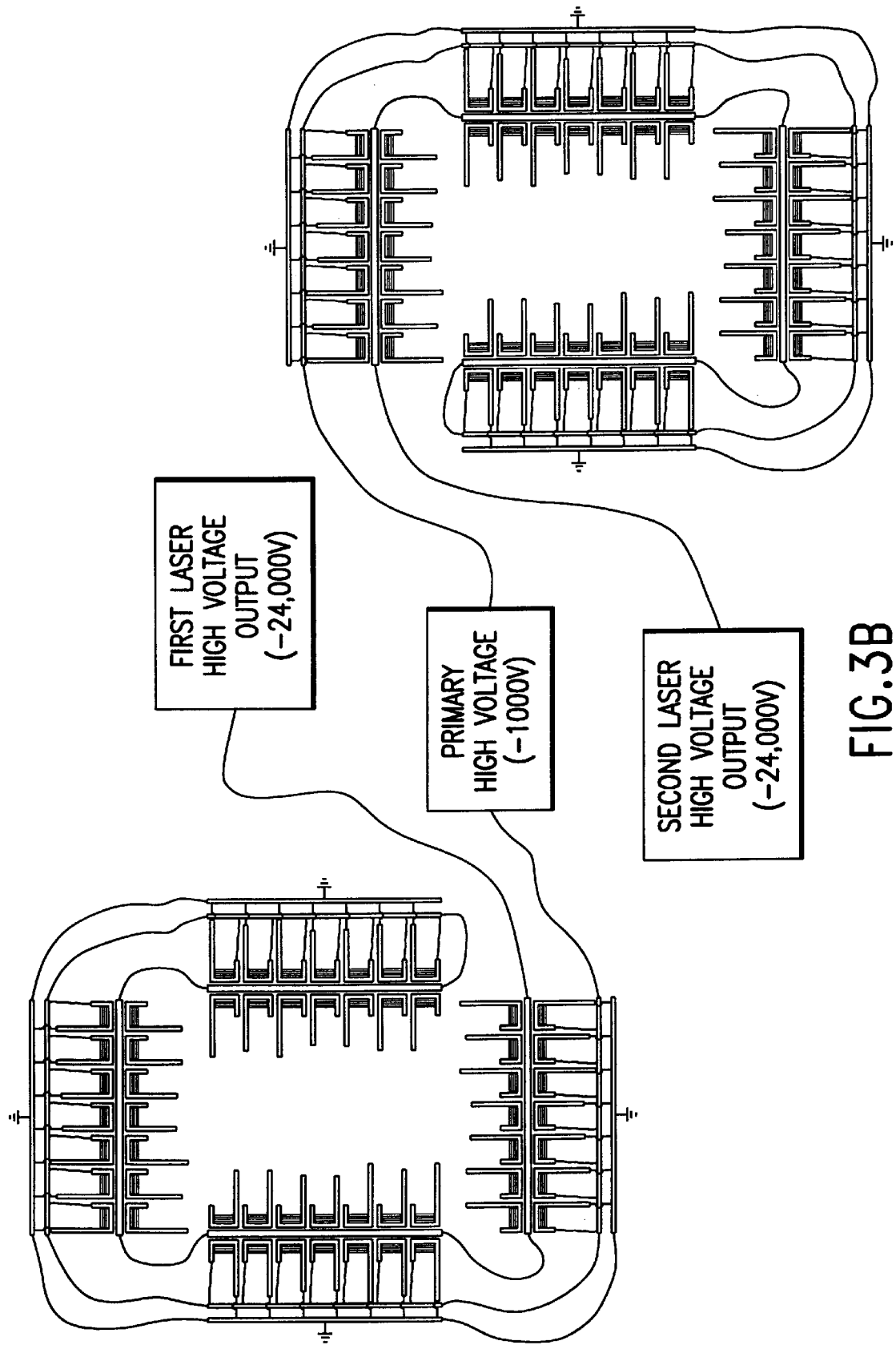

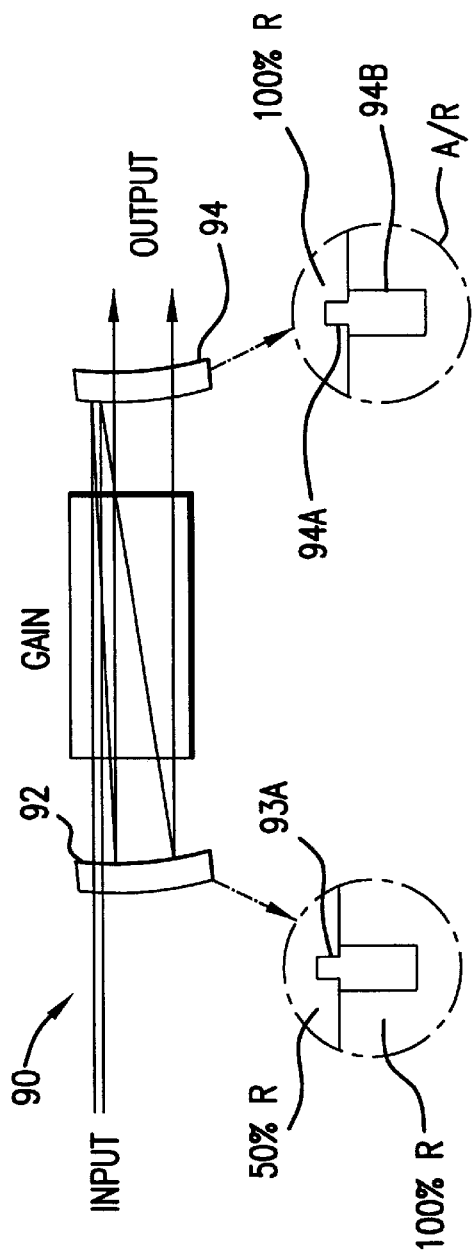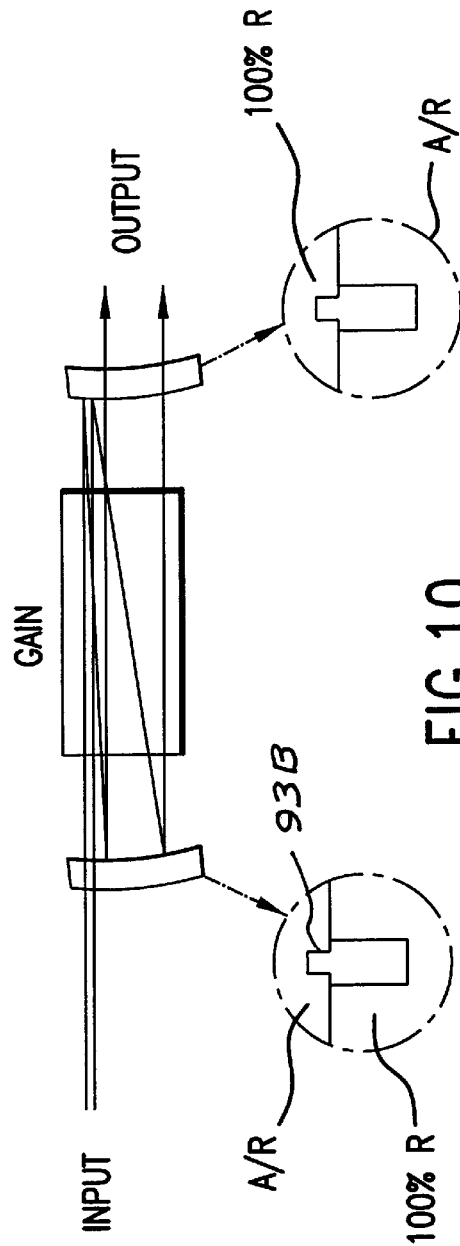

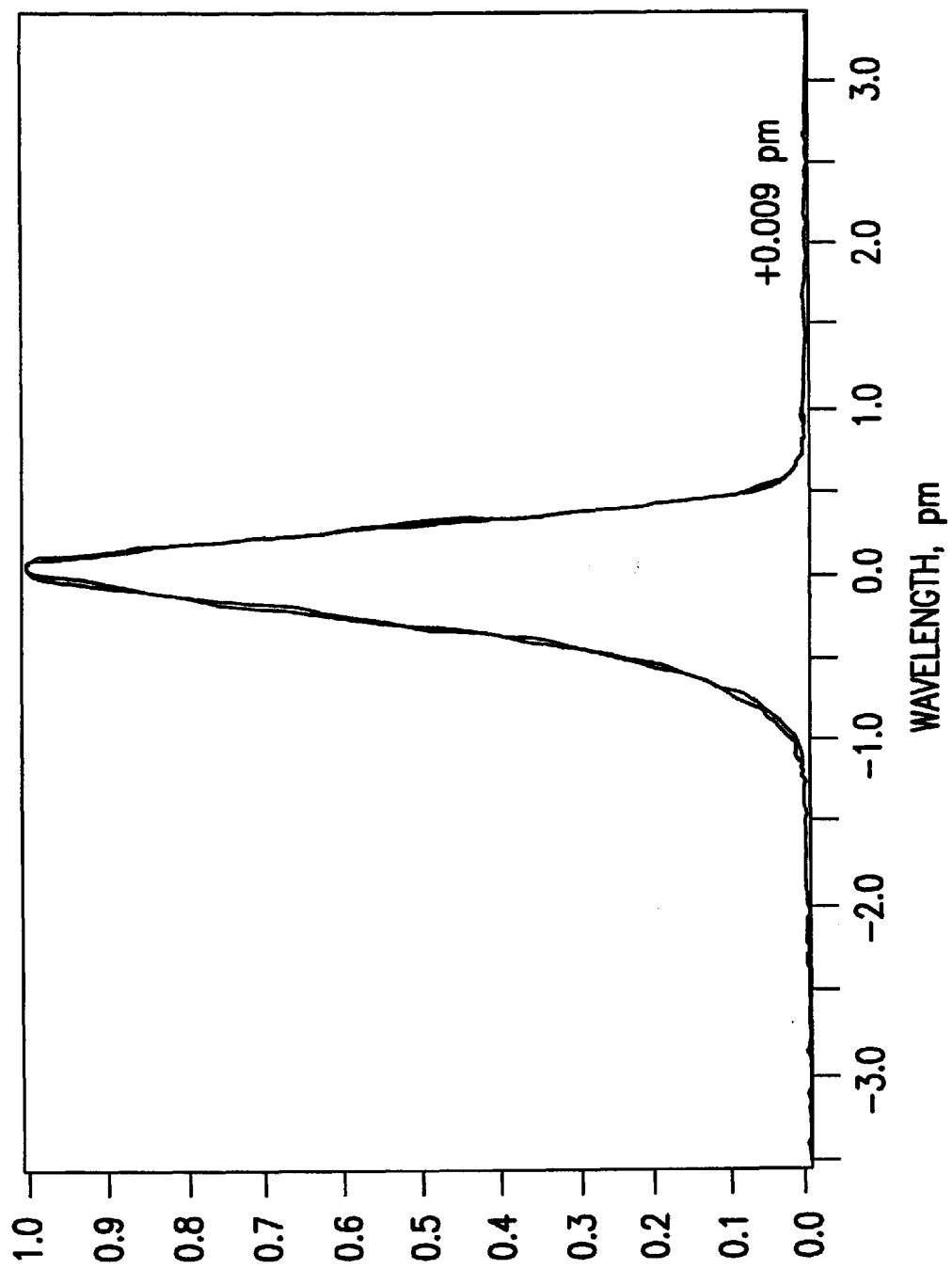
FIG.14B1

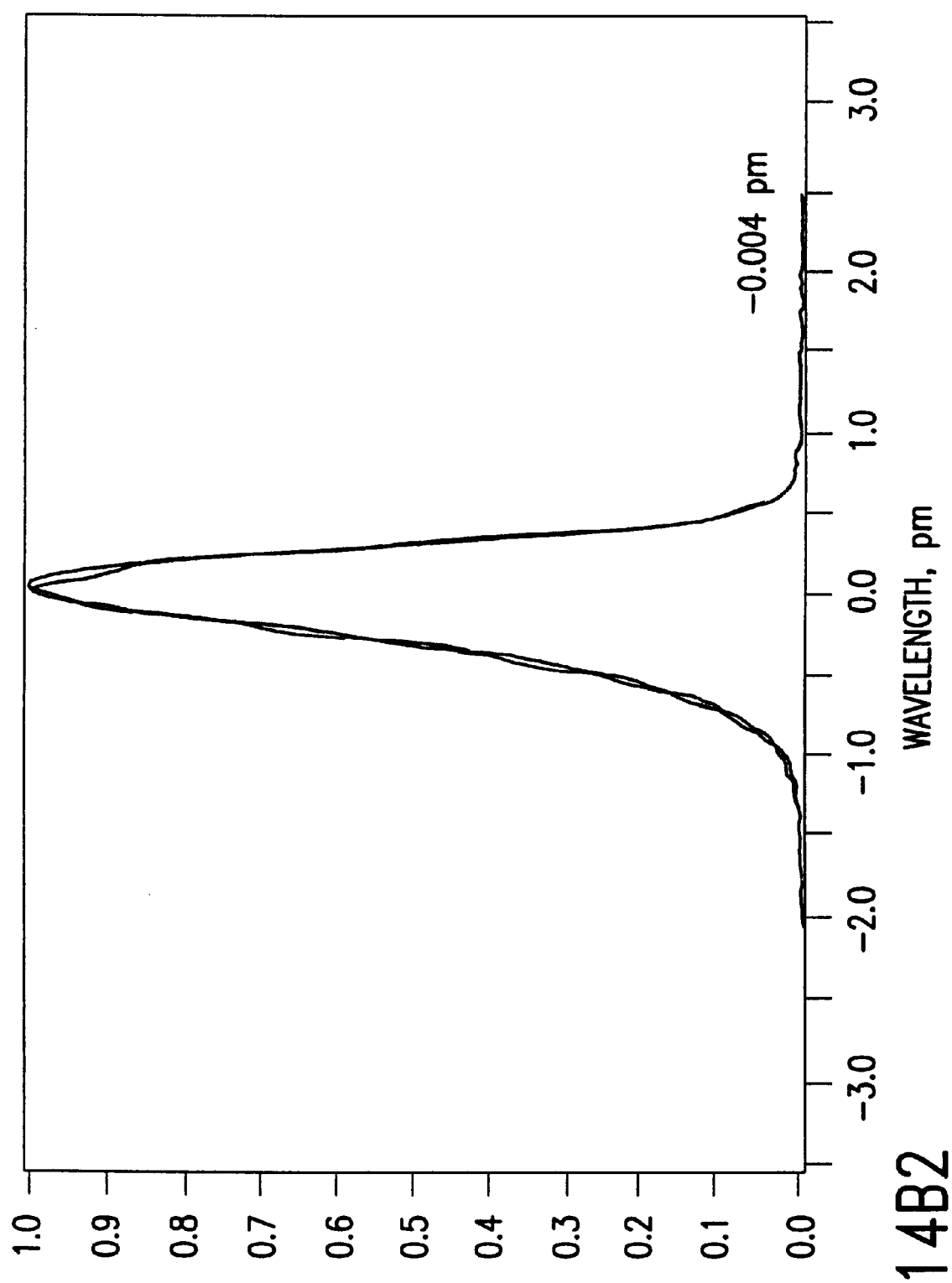
FIG. 14B2

- LINEAR PRESSURE DEPENDENCY
- PRESSURE SHIFT COEFFICIENTS:
  He : 1.84 fm/kPa
  Ne : 0.81 fm/kPa
- SLOPES PROPORTIONAL TO SQUARE ROOT OF MASS:
  1.84/0.81 = 2.27
  sqrt(20/4) = 2.24
- COMMON ZERO PRESSURE INTERCEPT

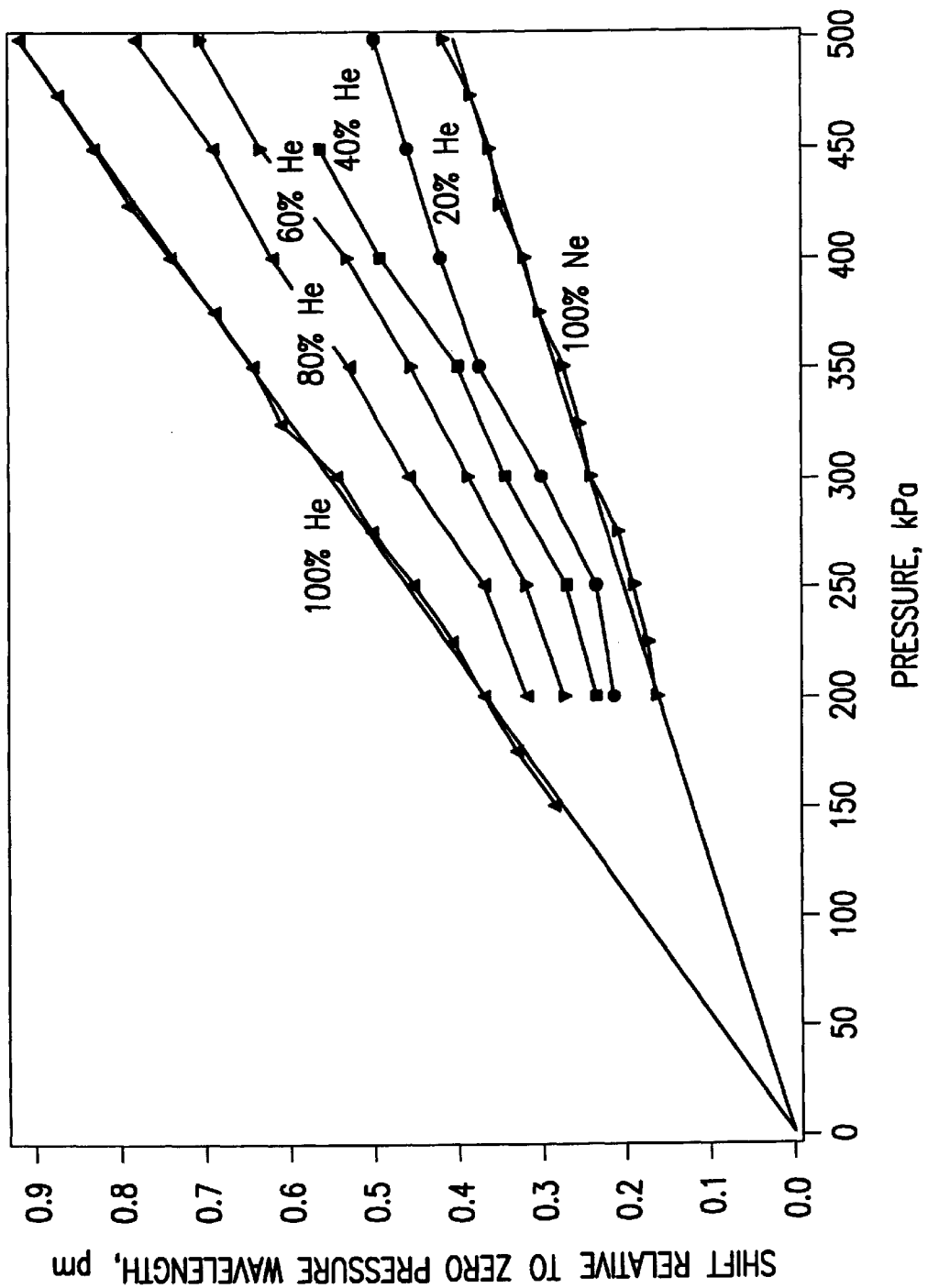
FIG.14D1

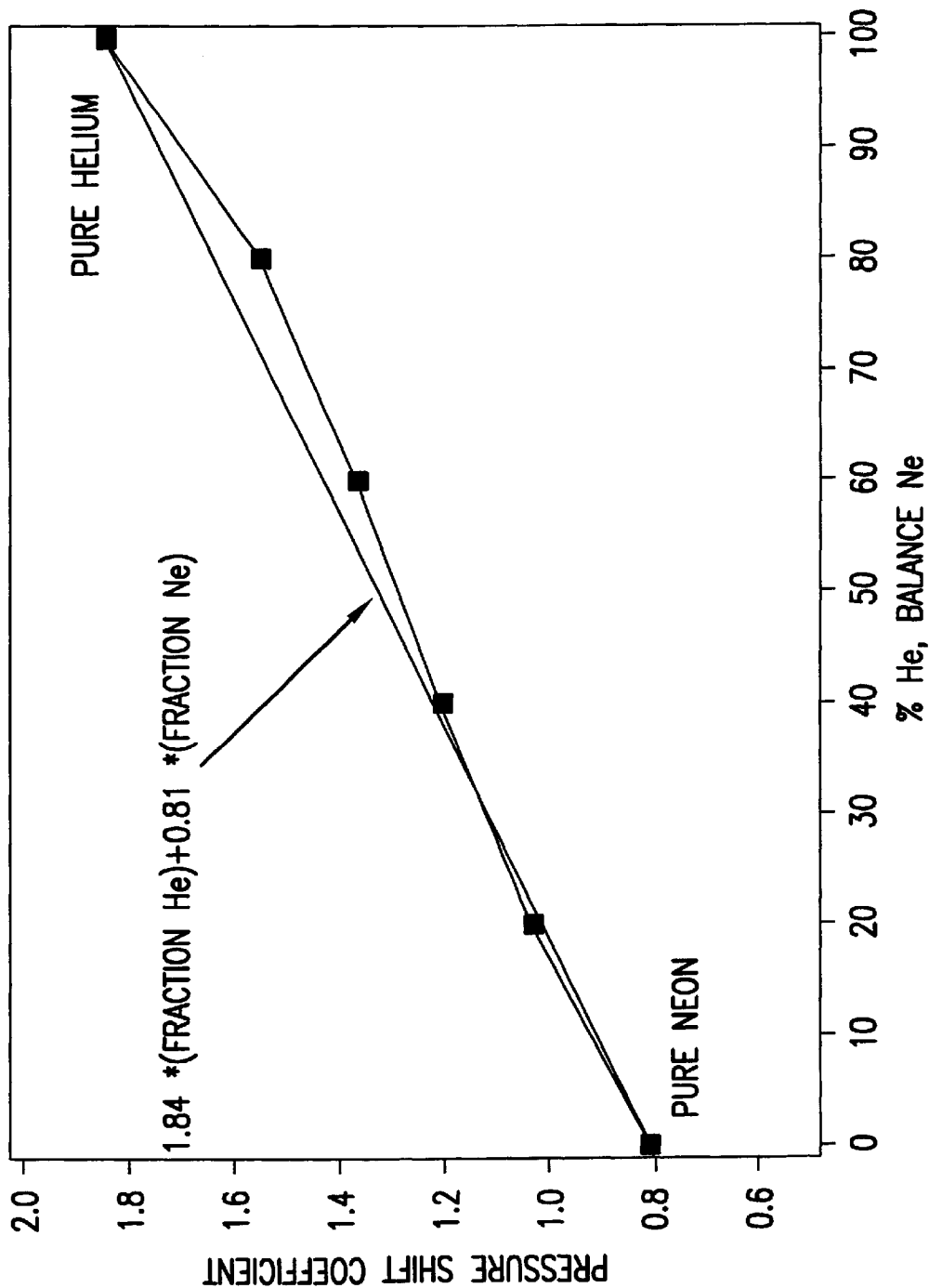
FIG.14D2

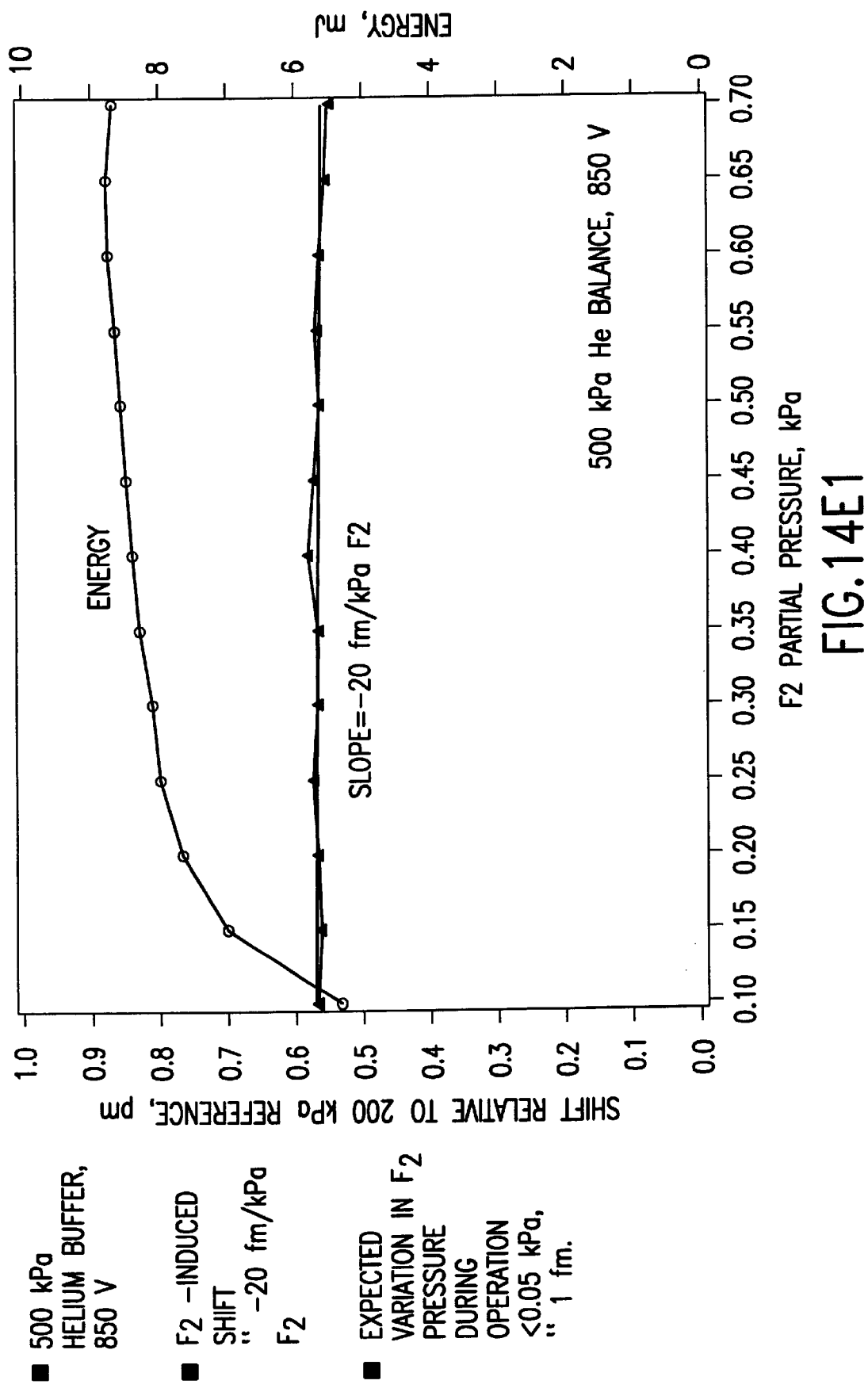
FIG.14E1

- HELIUM BUFFER AT 300, 500 kPa
- HV-INDUCED SHIFT ≈ 0.1 fm/V
- EXPECTED VOLTAGE VARIATION DURING OPERATION ≈ 200 V, ≈ 20 fm.
- MIGHT THE VARIATION WITH HV ACTUALLY BE CAUSED BY CHANGES IN OUTPUT ENERGY?

INJECTION SEEDED F$_2$ LASER WITH CENTERLINE WAVELENGTH CONTROL

This Application is a Continuation-In-Part of Ser. No. 09/854,097 filed May 11, 2001, "Four KhZ Gas Discharge Laser", Ser. No. 09/848,043 filed May 3, 2001, "Injection Seeded Laser with Precise Timing Control", Ser. No. 09/829,475 filed Apr. 9, 2001, "Injection Seeded F$_2$ Laser With Pre-Injection Filter", Ser. No. 09/473,795 filed Dec. 28, 1999, "Very Narrow Band Injection Seeded F2 Lithography Laser", Ser. No. 09/459,165 filed Dec. 10, 1999, "Injection Seeded F$_2$ Lithography Laser"; Ser. No. 09/438,249 filed Nov. 12, 1999, "F$_2$ Laser with Visible and IR Control"; Ser. No. 09/421,701, filed Oct. 20, 1999, "Single Chamber Gas Discharge Laser with Line Narrowed Seed Beam", and Ser. No. 09/407,120 filed Sep. 27, 1999, "Line Narrowed Laser with Etalon Output Coupler". This invention relates to lasers and in particular to injection seeded lasers useful for integrated circuit lithography.

BACKGROUND OF THE INVENTION

Prior Art Lithography Lasers

KrF excimer lasers are the state of the art light source for integrated circuit lithography. Such lasers are described in U.S. Pat. No. 4,959,840, U.S. Pat. No. 5,991,324 and U.S. Pat. No. 6,128,323. The lasers operate at wavelengths of about 248 nm. With the KrF laser integrated circuits with dimensions as small as 180 nm can be produced. Finer dimensions can be provided with ArF lasers which operate at about 193 nm or F$_2$ lasers which operate at about 157 nm. These lasers, the KrF laser, the ArF laser and the F$_2$ lasers, are very similar, in fact the same basic equipment used to make a KrF laser can be used to produce an ArF laser or an F$_2$ laser merely by changing the gas concentration, increasing the discharge voltage and modifying the controls and instrumentation to accommodate the slightly different wavelength. A typical prior-art KrF excimer laser used in the production of integrated circuits is depicted in FIGS. 1, 1A and 1B. A cross section of the laser chamber of this prior art laser is shown in FIG. 1B. As shown in FIG. 1A, pulse power system 2 powered by high voltage power supply 3 provides electrical pulses to electrodes 6 located in a discharge chamber 8. Typical state-of-the art lithography lasers are operated at a pulse rate of about 1000 to 2000 Hz with pulse energies of about 10 mJ per pulse. The laser gas (for a KrF laser, about 0.1% fluorine, 1.3% krypton and the rest neon which functions as a buffer gas) at about 3 atmospheres is circulated through the space between the electrodes at velocities of about 1,000 to 2,000 cm per second. This is done with tangential blower 10 located in the laser discharge chamber. The laser gases are cooled with a heat exchanger 11 also located in the chamber and a cold plate (not shown) mounted on the outside of the chamber. The natural bandwidth of the excimer lasers is narrowed by line narrowing module 18 (sometimes referred to as a line narrowing package or LNP). Commercial excimer laser systems are typically comprised of several modules that may be replaced quickly without disturbing the rest of the system. Principal modules include:

Laser Chamber Module,
High voltage power supply module,
High voltage compression head module,
Commutator module,
Output Coupler Module,
Line Narrowing Module,
Wavemeter Module,
Computer Control Module,
Gas Control Module,
Cooling Water Module Electrodes 6 consist of cathode 6A and anode 6B. Anode 6B is supported in this prior art embodiment by anode support bar 44 which is shown in cross section in FIG. 1B. Flow is counter-clockwise in this view. One corner and one edge of anode support bar 44 serves as a guide vane to force air from blower 10 to flow between electrodes 6A and 6B. Other guide vanes in this prior art laser are shown at 46, 48 and 50. Perforated current return plate 52 helps ground anode 6B to the metal structure of chamber 8. The plate is perforated with large holes (not shown in FIG. 3) located in the laser gas flow path so that the current return plate does not substantially affect the gas flow. A peaking capacitor bank comprised of an array of individual capacitors 19 is charged prior to each pulse by pulse power system 2. During the voltage buildup on the peaking capacitor, one or two preionizers 56 weakly ionize the lasing gas between electrodes 6A and 6B and as the charge on capacitors 19 reaches about 16,000 volts, a discharge across the electrode is generated producing the excimer laser pulse. Following each pulse, the gas flow between the electrodes of about 1 to 2 cm per millisecond, created by blower 10, is sufficient to provide fresh laser gas between the electrodes in time for the next pulse occurring one half to one millisecond later.

In a typical lithography excimer laser, a feedback control system measures the output laser energy of each pulse, determines the degree of deviation from a desired pulse energy, and then sends a signal to a controller to adjust the power supply voltage so that energy of the subsequent pulse is close to the desired energy. These excimer lasers are typically required to operate continuously 24 hours per day, 7 days per week for several months, with only short outages for scheduled maintenance.

Injection Seeding

A well-known technique for reducing the band-width of gas discharge laser systems (including excimer laser systems) involves the injection of a narrow band "seed" beam into a gain medium. In one such system, a laser called the "seed laser" or "master oscillator" is designed to provide a very narrow laser band beam and that laser beam is used as a seed beam in a second laser. If the second laser functions as a power amplifier, the system is typically referred to as a master oscillator, power amplifier (MOPA) system. If the second laser itself has a resonance cavity, the system is usually referred to as an injection seeded oscillator (ISO) and the seed laser is usually called the master oscillator and the downstream laser is usually called the power oscillator.

Jitter Problems

In gas discharge lasers of the type referred to above, the duration of the electric discharge is very short duration, typically about 20 to 50 ns (20 to 50 billions of a second). Furthermore, the population inversion created by the discharge is very very rapidly depleted so that the population inversion effectively exists only during the discharge. In these two laser systems, the population in the downstream laser must be inverted when the beam from the upstream laser reaches the second laser. Therefore, the discharges of the two lasers must be appropriately synchronized for proper operation of the laser system. This can be a problem because within typical pulse power systems there are several potential causes of variation in the timing of the discharges. Two of the most important sources of timing variations are voltage variations and temperature variations in saturable inductors used in the pulse power circuits. It is known to monitor the pulse power charging voltage and inductor temperatures and to utilize the data from the measurements and a delay circuit to normalize timing of the discharge to desired values. One prior art example is described in U.S. Pat. No. 6,016,325 which is incorporated herein by reference. There in the prior art timing errors can be reduced but they could not be eliminated. These errors that ultimately result are referred to as "jitter".

Laser Wavelength and Bandwidth

A typical KrF laser has a natural bandwidth of about 300 pm (FWHM) centered at about 248 nm and for lithography use, it is typically line narrowed to about 0.6 pm. ArF lasers have a natural bandwidth of about 500 centered at about 193 nm and is typically line narrowed to about 0.5 pm. These lasers can be relatively easily tuned over a large portion of their natural bandwidth using the line narrowing module 18 shown in FIG. 2. Also for the KrF and ArF lasers, the absolute wavelength of the output beam can be determined accurately by comparing its spectrum to atomic reference lines during laser operation. $F_2$ lasers typically produce laser beams with most of its energy in two narrow lines centered at about 157.63 nm and 157.52 nm. Often, the less intense of these two lines (i.e., the 157.52 nm line) is suppressed and the laser is forced to operate at the 157.63 nm line. The natural bandwidth of the 157.63 nm line is pressure dependant and varies from about 0.6 to 1.2 pm. An $F_2$ laser with a bandwidth in this range can be used with lithography devices utilizing a catadiophic lens design utilizing both refractive and reflective optical elements, but for an all-refractive lens design the laser beam should have a bandwidth to produce desired results. It is also known that the centerline wavelength of the output beam will vary somewhat depending on condition in the discharge region.

Lasers for lithography equipment are very complicated and expensive. Further reduction in bandwidth could greatly simplify the lens design for lithography equipment and/or lead to improved quality of integrated circuits produced by the equipment. Thus, a need exists for lithography lasers (including KrF, ArF and $F_2$ lasers) with substantially reduced bandwidth.

Bandwidth Control

The wavelength of KrF and ArF lasers is relatively easily controlled over ranges of a few hundred picometers corresponding to their natural bandwidths. The $F_2$ laser or the other hand has in part been considered untunable since the a large portion of its output is concentrated in two narrow lines. Several techniques have been prepared for selecting one of the lines and eliminating energy in the other line.

Optical Filters

There are many optical filters for selecting out narrow ranges of light in a beam. One such filter is a monochromator in which light passing through a first slit is collimated with a lens, dispersed spectrally with a dispersing element such as a prism or grating and the dispensed light is then focused to a focal plane with a selected spectral range collected through a slit located at the local plane. What is needed are techniques to reduce the bandwidth and control the center wavelength wavelength of the $F_2$ laser systems. A need also exists for a method of determining precisely the absolute centerline wavelength of $F_2$ laser systems.

SUMMARY OF THE INVENTION

The present invention provides a narrow band laser system having two laser subsystems. The first laser subsystem is configured to provide a very narrow band pulsed output beam which is used to injection seed the second laser subsystem where the narrow band pulsed seed beam is amplified to produce a narrow band pulsed output beam. A pulse power supply is provided which is specially configured to precisely time the discharges in the two laser subsystem so that the discharges are properly synchronized. The laser gas comprises $F_2$ at a partial pressure less than about 1% with a buffer gas comprised of helium or neon or a combination of helium and neon. Control of center wavelength of the output beam is provided by adjusting one or more of the following parameters in the first laser: the total laser gas pressure, the relative concentration of helium or neon, $F_2$ partial pressure, laser gas temperature, discharge voltage and pulse energy.

For precise jitter control in preferred embodiments include a pulse power system with a pulse transformer unit having two sets of transformer cores. A single upstream pulse compression circuit provides high voltage pulses in parallel to the primary windings of all of the cores in both sets. Separate secondary conductors (one passing through one set of cores and the other passing through the other set of cores) provide very high voltage pulses respectively to separate downstream circuits supplying discharge pulses to the electrodes in each of two separate laser chambers. In preferred embodiments line narrowing is accomplished within the resonant cavity of the seed laser and/or the output of the seed laser could be line narrowed using a pre-gain filter.

BRIEF DESCRIPTION OF THE DRAWINGS

FIG. 3B is a drawing showing features of FIG. 3A.

FIG. 3C1 is a B-H curve.

FIGS. 9 and 10 are diagrams of power gain stages.

FIGS. 14A through 14H are graphs of spectral data.

DETAILED DESCRIPTION OF PREFERRED EMBODIMENTS

Applicants' Experiments

In order to understand and characterize the effect of variations in various $F_2$ laser operating parameters on the centerline wavelength and bandwidth of F2 laser systems, Applicants have conducted careful experiments described below.

$F_2$ Laser Absolute Wavelength

Figure 13:
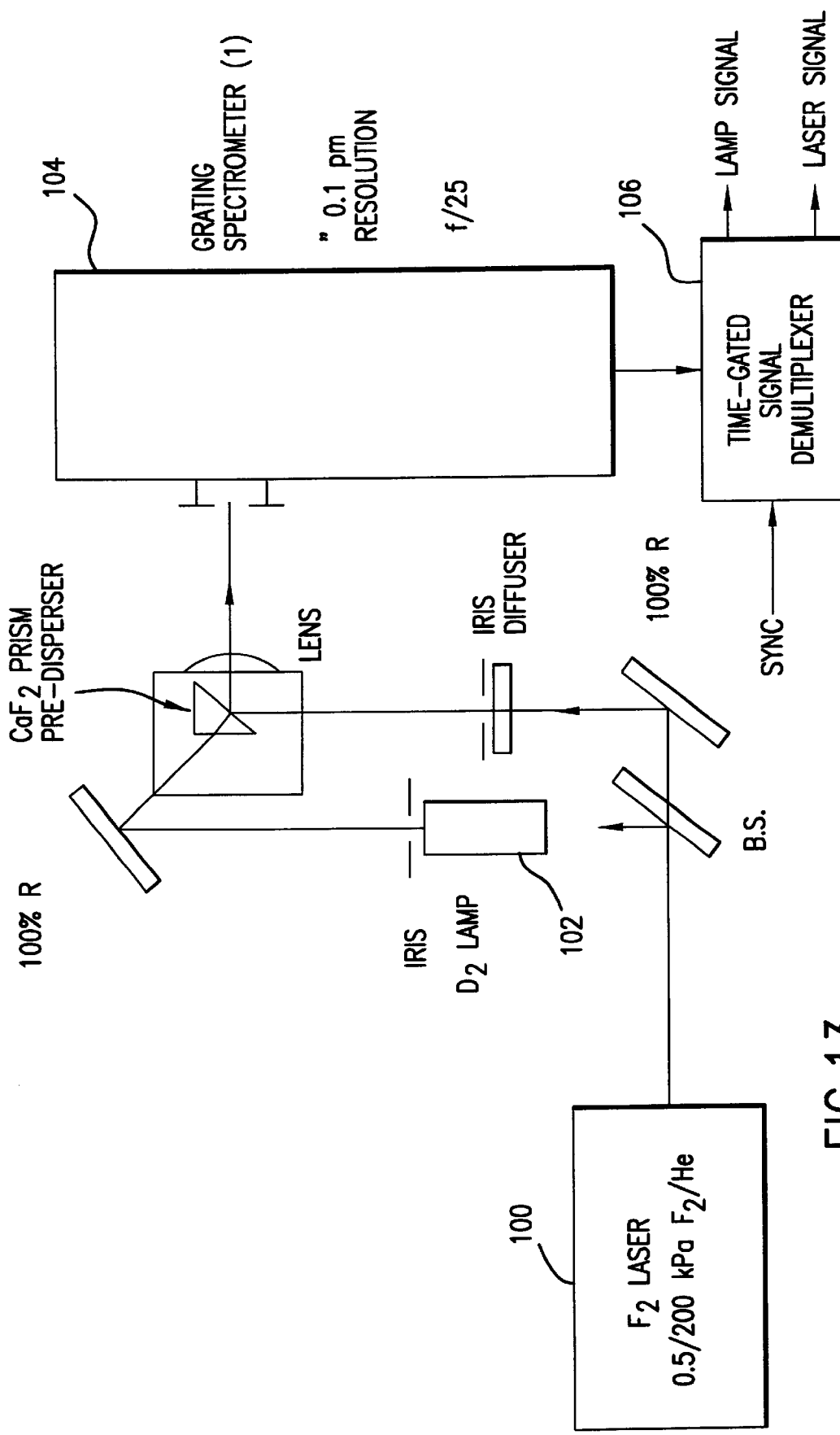
FIG. 13 shows a setup for determining the absolute values of centerline wavelength.

A setup to measure the $F_2$ laser absolute wavelength is shown in FIG. 13. The output of an $F_2$ laser 100 with 0.5 percent $F_2$ and the balance helium at a total gas pressure of 200 kPa is combined with the output of deuterium lamp 102 as shown in FIG. 13. The two beams are monitored with a grating spectrometer 104 with a 0.1 pm resolution. A time-grated signal muntiplex 106 permits separate recording of the lamp signal and the laser signal. Time grating was used to measure the combined signal during a very short interval surrounding the laser pulse for the $F_2$ measurement, and the $D_2$ measurement was taken over a longer period of time intervals.

Figure 13A:
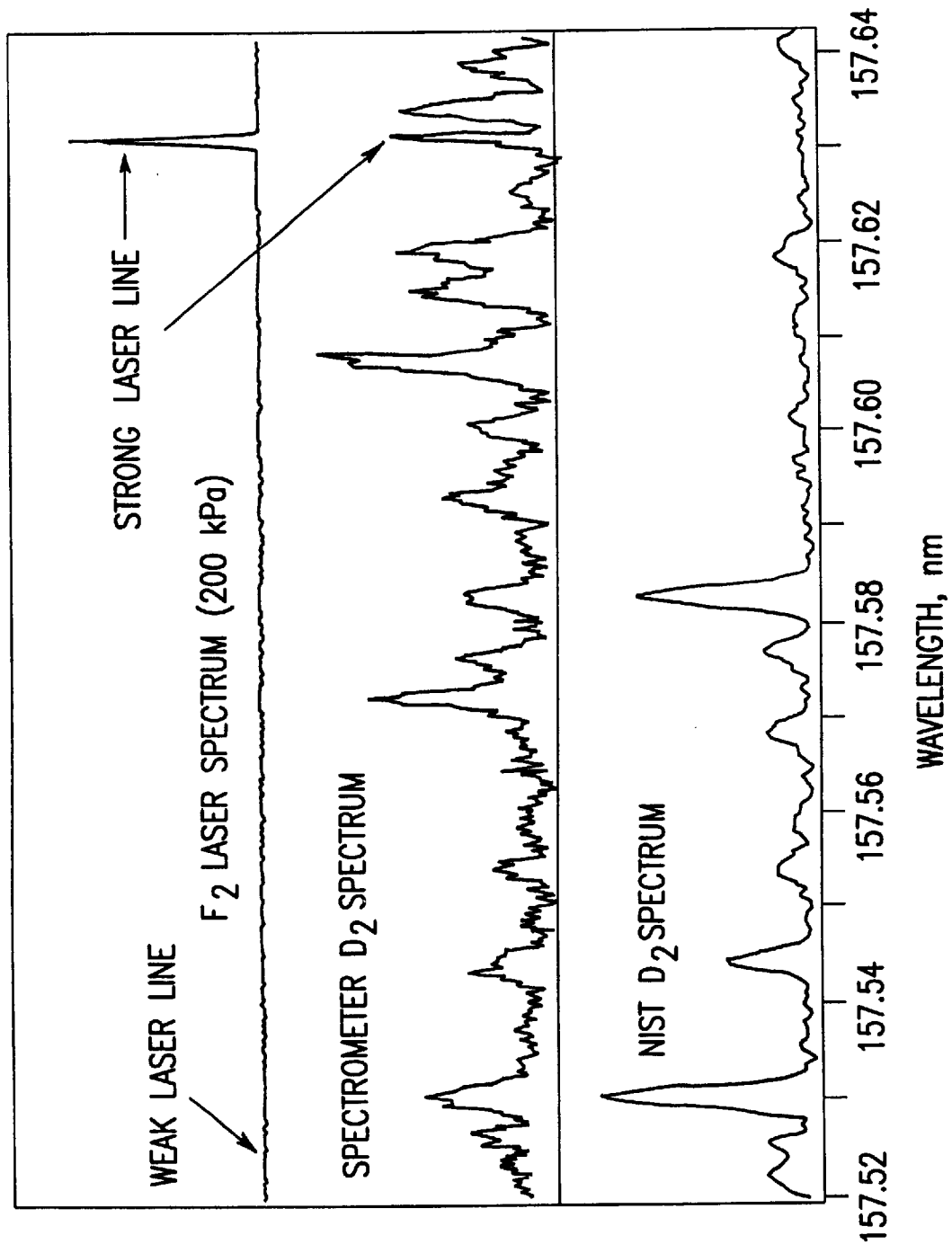
FIGS. 13A through 13D are spectral data graphs.
Figure 13B:
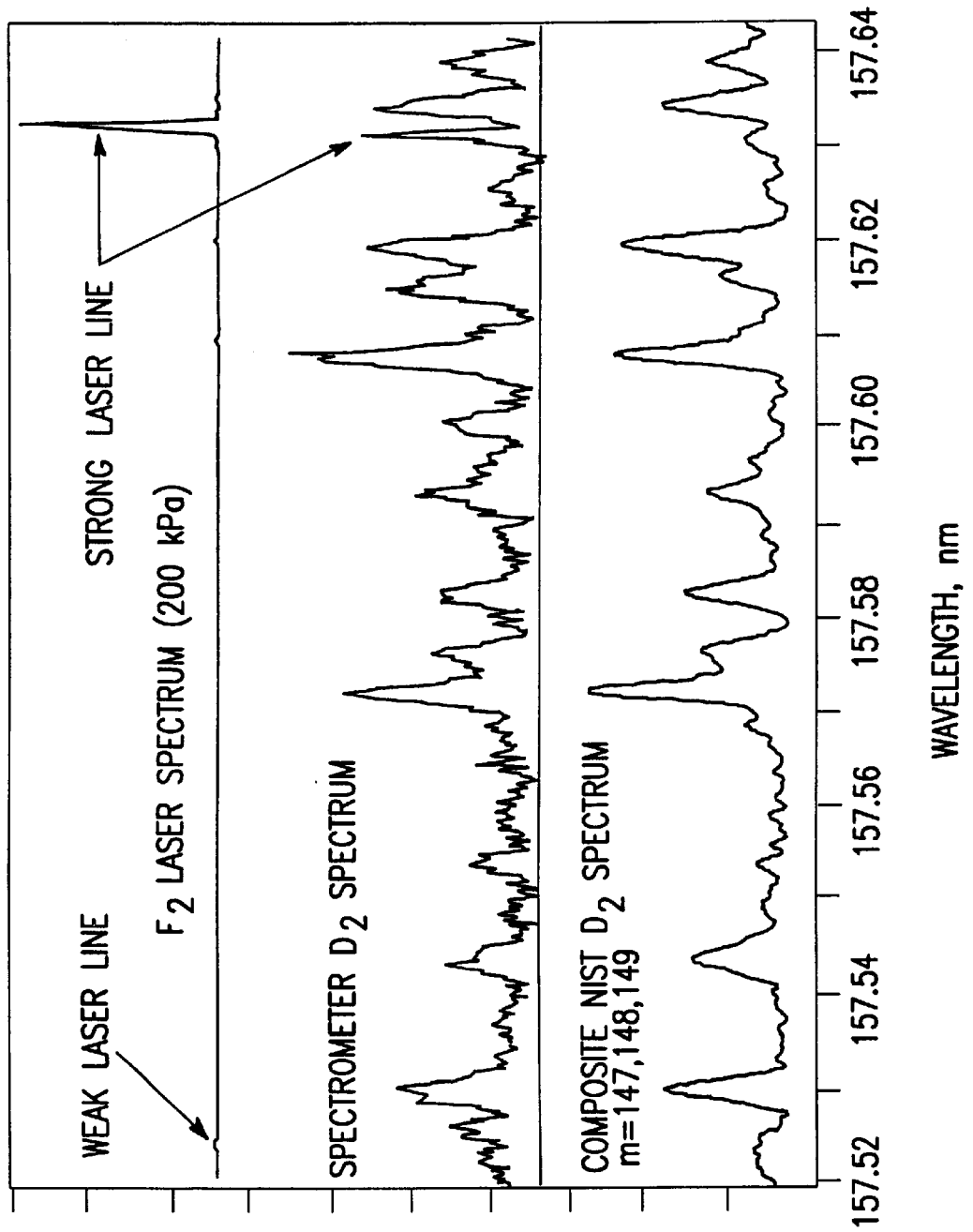

FIG. 13A shows the spectral results with the $F_2$ spectrum plotted in the top space, the measured $D_2$ spectrum in the second space and a reference$D_2$ spectrum made available by the National Institute of Standards and Technology (NIST). The strong $F_2$ laser line at about 157.63 nm is clearly apparent in the $F_2$ plot. The line also appears in the $D_2$ plot since the same residue from the laser measurement was left over after the grating for the $F_2$ measurement the NIST data shown in FIG. 13A was obtained using techniques different from those employed by Applicants which record adjacent grating orders not recorded in the NIST data. In FIG. 13B Applicants have included additional grating orders on the NIST data with the results shown in the bottom space on FIG. 13B. This data shows close agreement of the spectral features with the $D_2$ data recorded by Applicants confirming the accuracy of the Applicants data at least with respect to the position of important $D_2$ spectral lines near the two major $F_2$ lines.

Figure 13C:
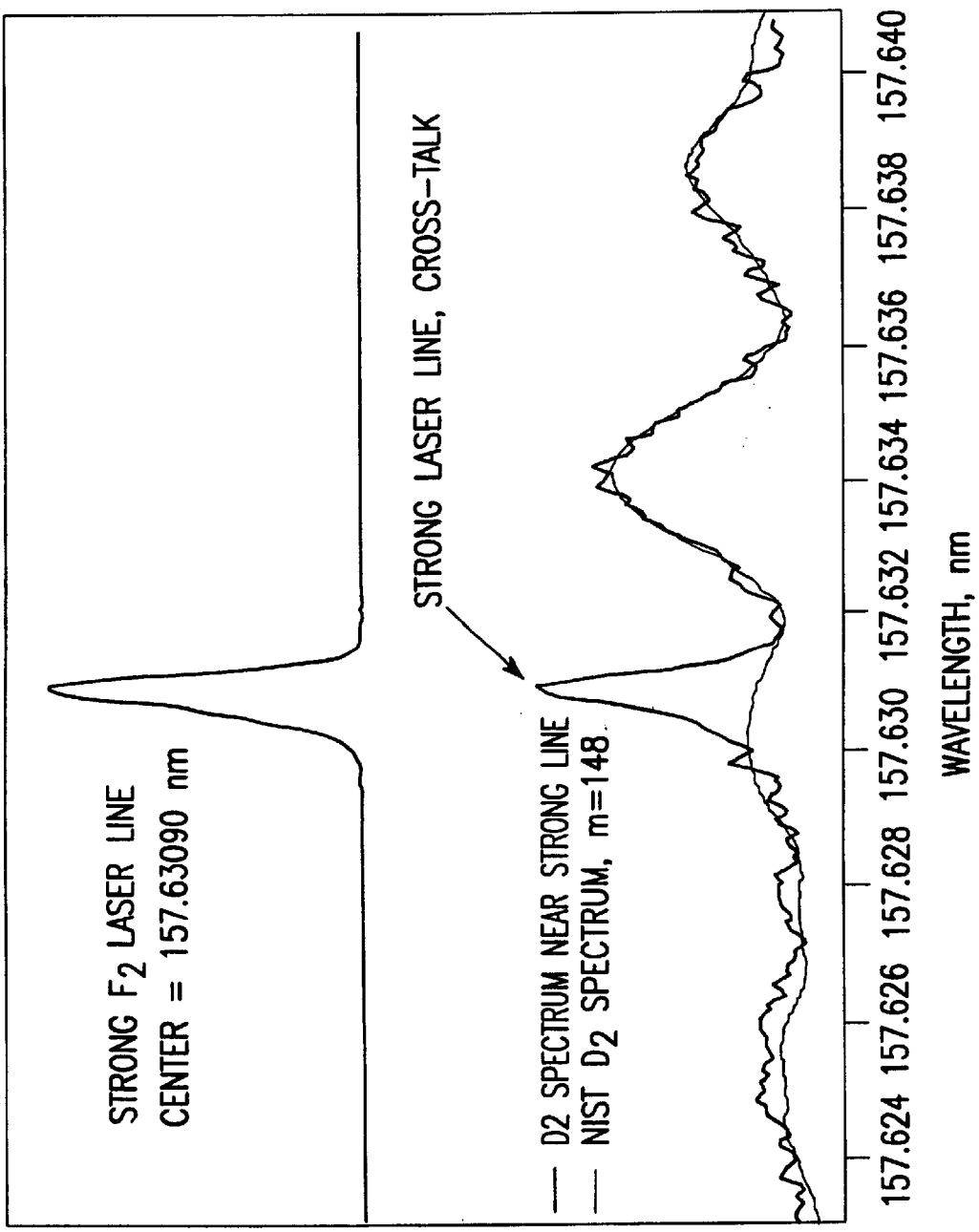

FIG. 13C is an enlarged portion of the spectrum near the strong $F_2$ line with the NIST $D_2$ data superimposed on Applicants' $D_2$ data. The data shows that under the conditions of the test laser gas pressure of 2000 kPa with helium buffer and 0.5 percent $F_2$ the strong laser line is centered at 157.63070 nm with an estimated error of ±0.1 pm.

Figure 13D:
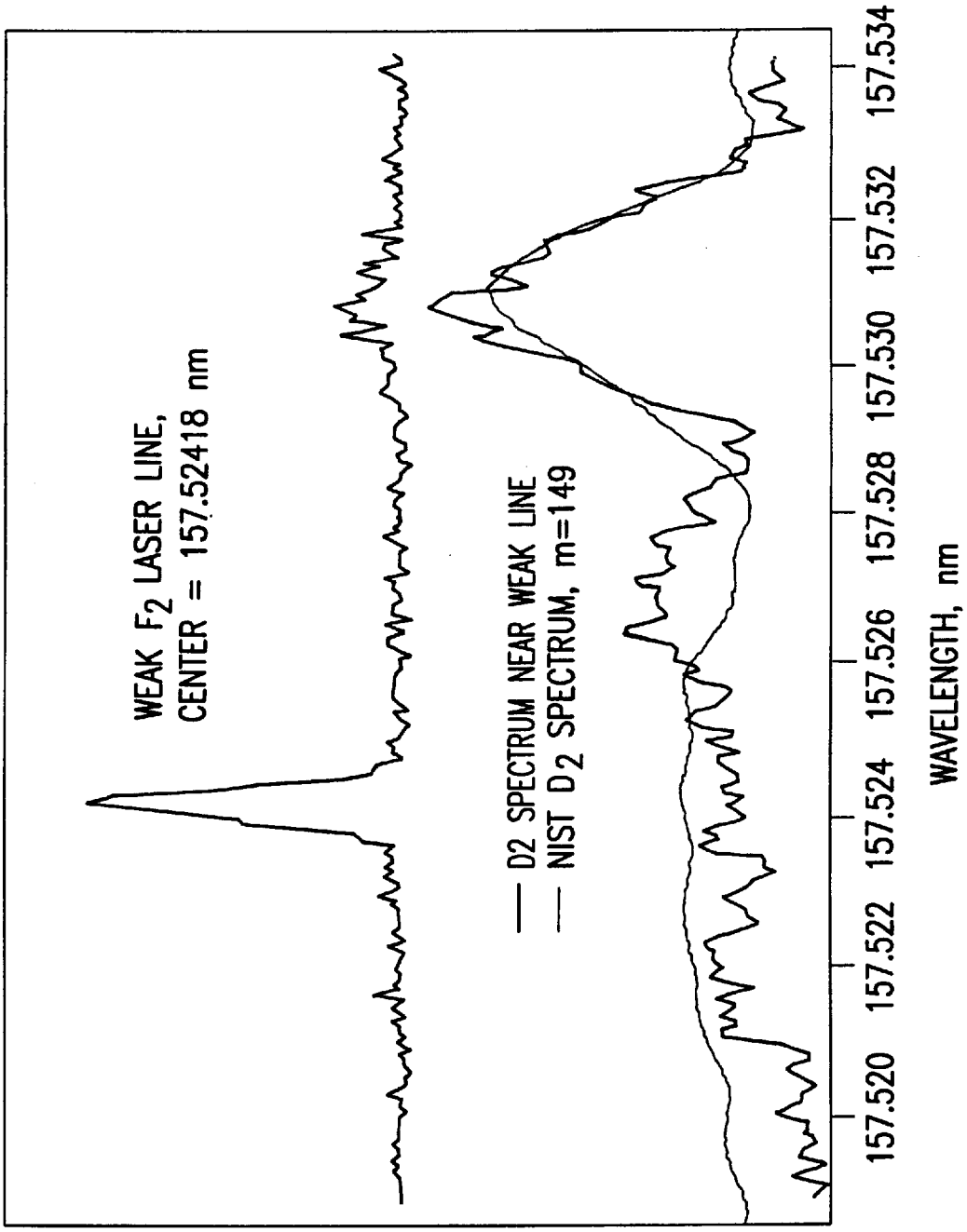

The weak line is similarly displayed in FIG. 13D and it is under these conditions centered at 157.5218 nm with an estimated error of ±0.1 pm.

These two results are compared in FIG. 13D to the results of experiments by NIST and Lambda Physik as reported in Samsonetti, et al., *Applied Optics*, Vol. 40, No. 12, pp. 1974–1978 (April, 2001).

Measurement of Wavelength Shifts

Figure 14:
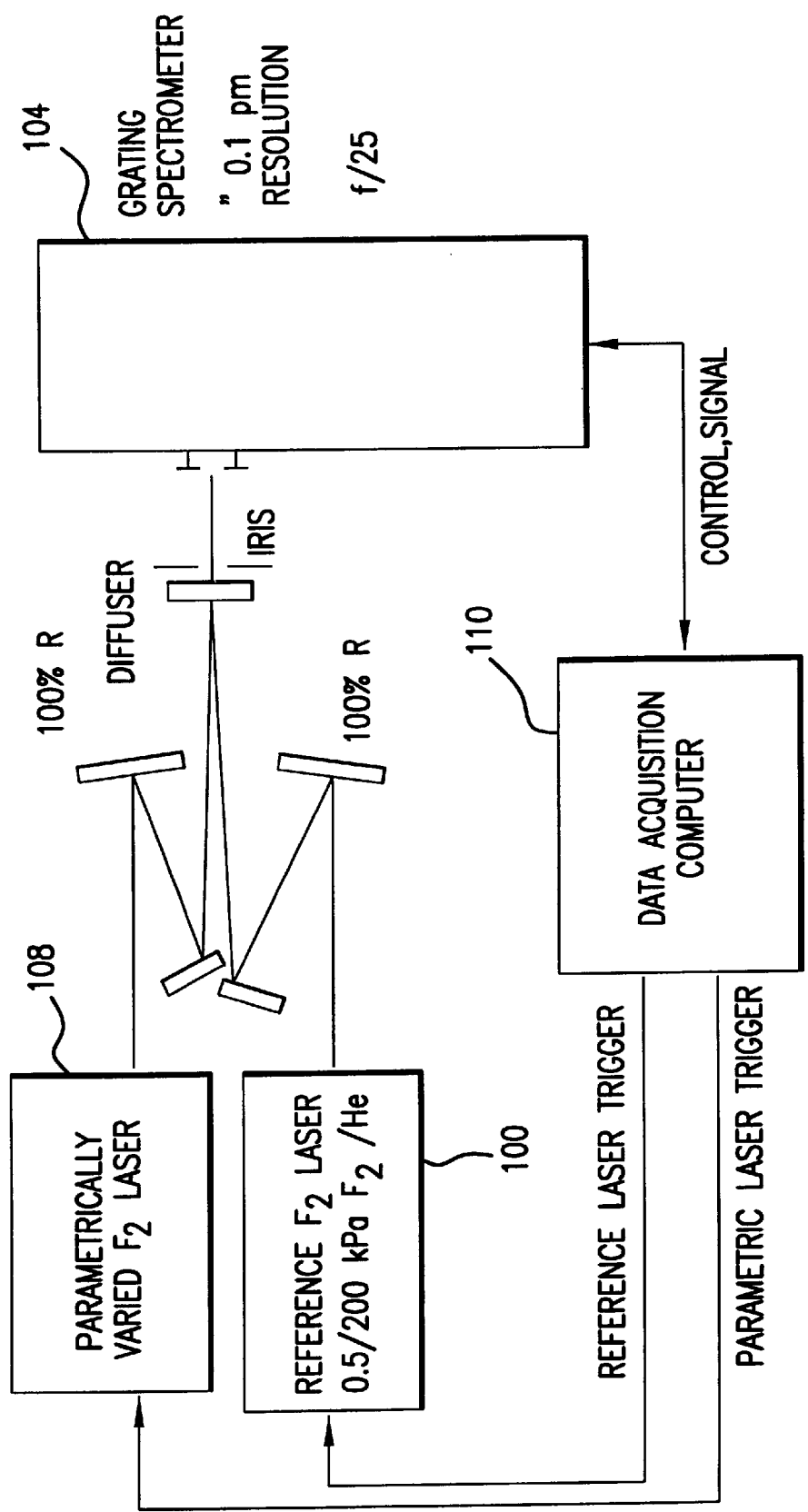
FIG. 14 shows a setup for measuring the effect of parameter changes on centerline wavelength and bandwidth.

FIG. 14 shows a setup used by Applicants to measure center wavelength shifts due to variation of laser operating parameters. In this case a reference $F_2$ laser 100 maintained at the same conditions utilized in the $D_2$ experiments (FIG. 13). The output of this laser is compared with that of a parametrically varied F2 laser 108 using the same spectrometer 104 and the output is monitored by a data acquisition computer programmed with a special Lab View data acquisition program.

Figure 14A:
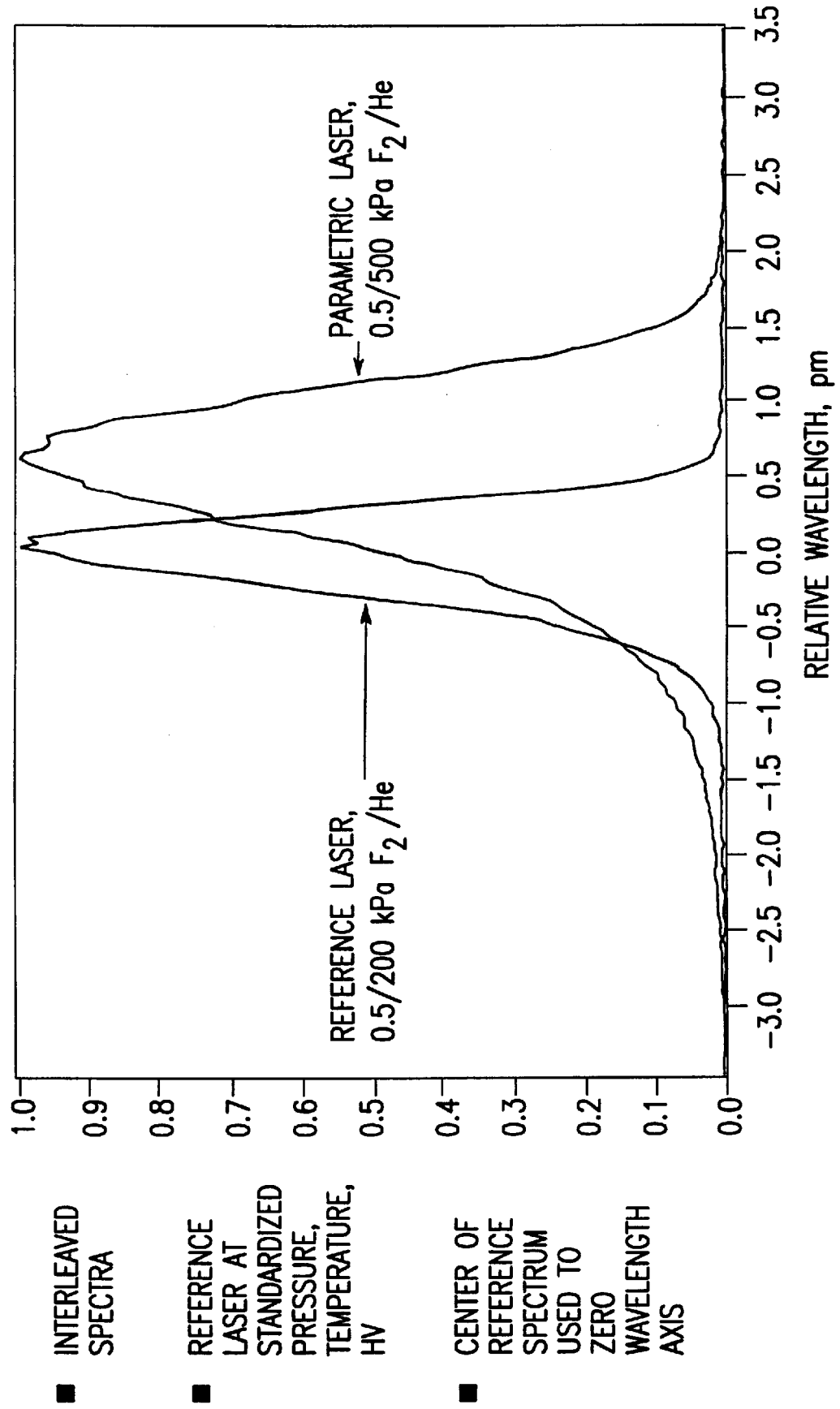

FIG. 14A shows some typical spectral data in which laser 108 pressure was maintained at 200 kPa. The spectral shift, both in centerline and bandwidth is clearly apparent.

Figure 14C:
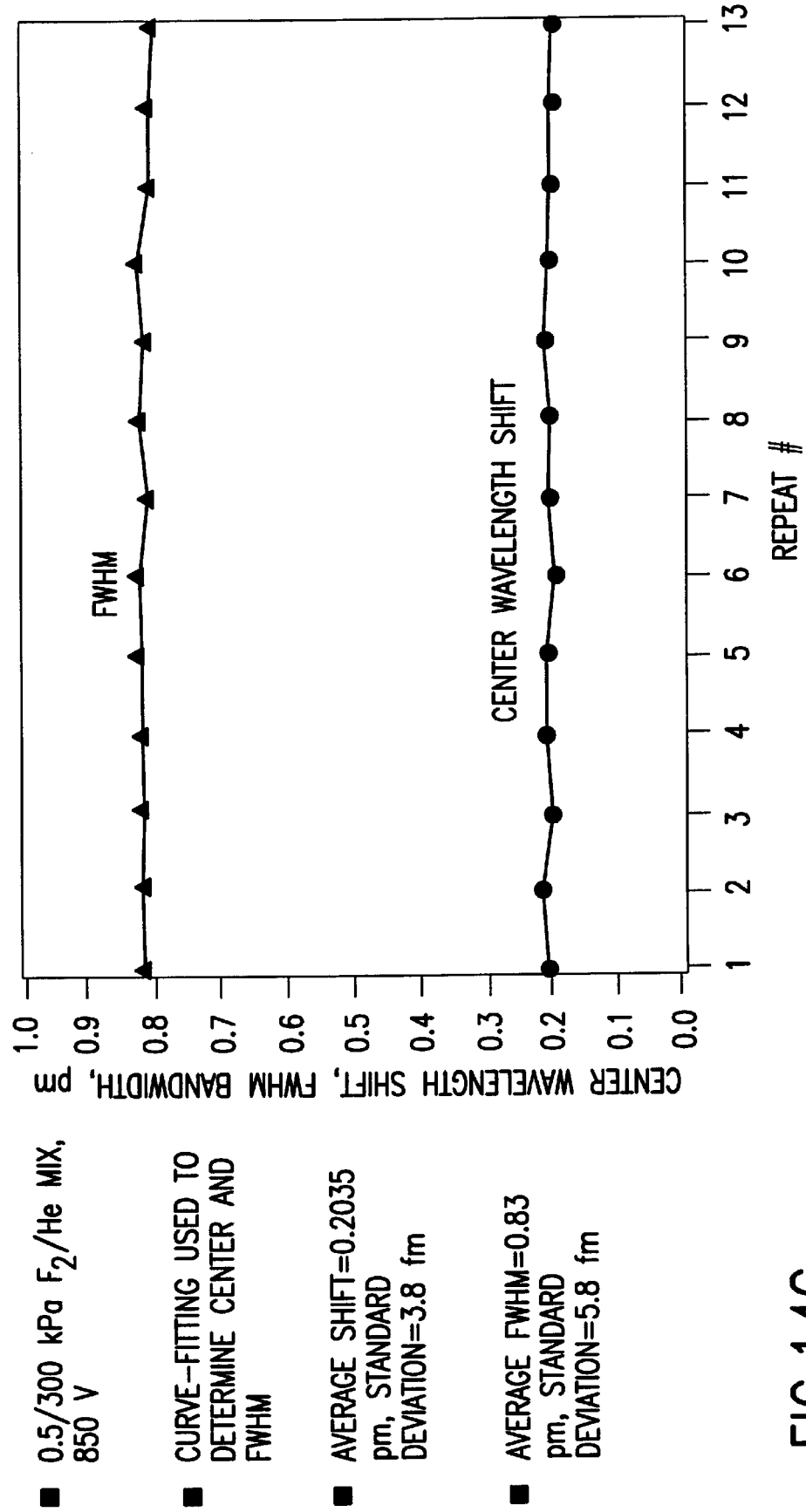

FIG. 14B shows the result of a consistence check in which both laser 108 and laser 100 were operated at 200 kPa. The center-to-center consistency was within +/−10 fm. As shown in FIG. 14C, another consistence check was made with 13 measurements to estimate the standard deviation for both centerline shift and bandwidth (FWHM) to measured standard deviation values were 3.8 fm for a 0.2035 average centerline shift and 5.8 fm for an average bandwidth of 0.83 pm (FWHM). These data are plotted in FIG. 14C.

Figure 14D:
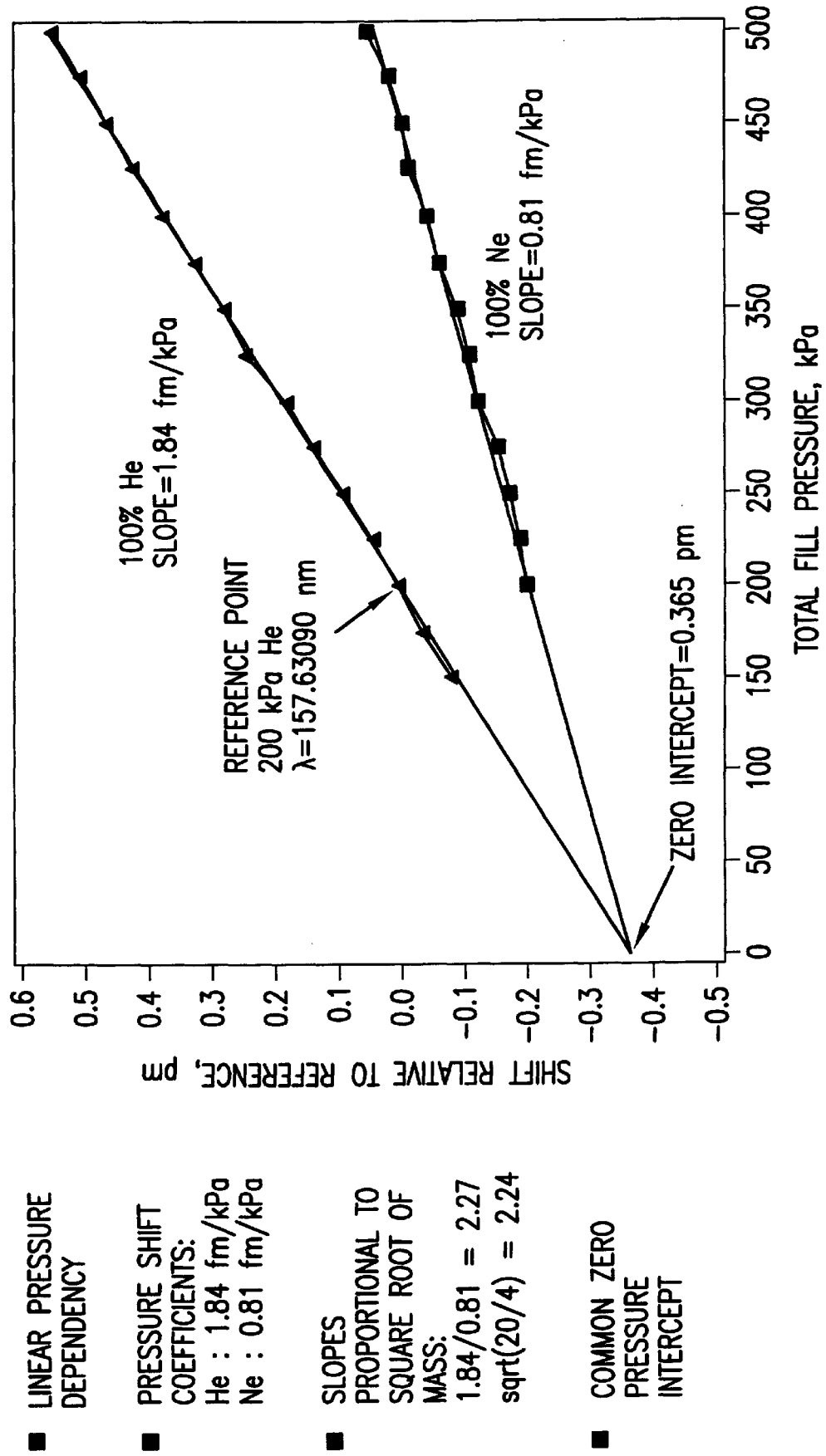

FIG. 14D shows plots of centerline shift as a function of full pressure in kPa with both He and Ne as buffer gasses. The result is a straight line variation with pressure coefficients of 1.84 fm/kPa for Ne. The two curves display a common intercept. The slopes are approximately proportional to the square root of the masses of the two gasses.

Figure 14E:
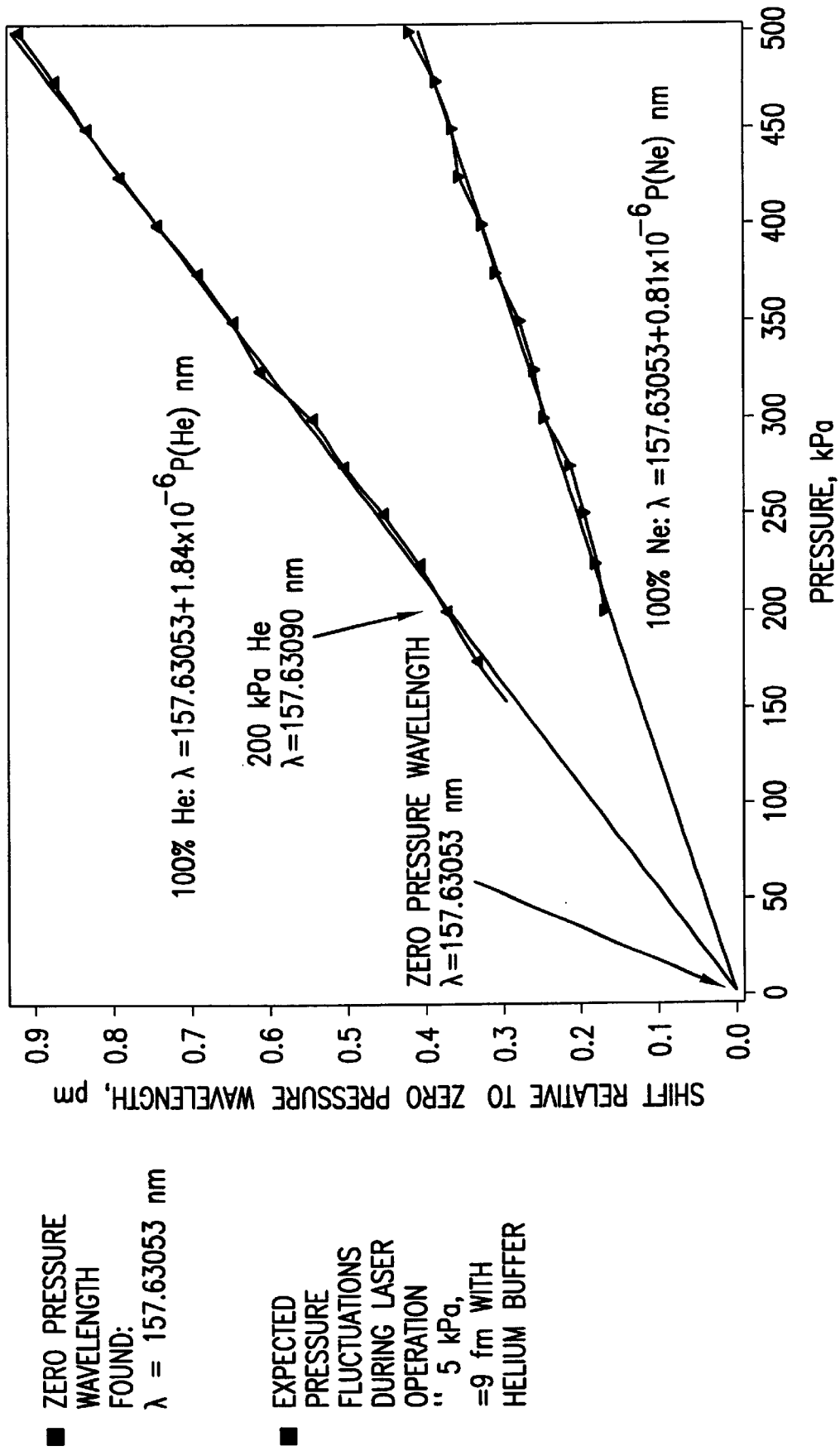

FIG. 14E shows a technique to determine the zero pressure wavelength.

Figure 1:
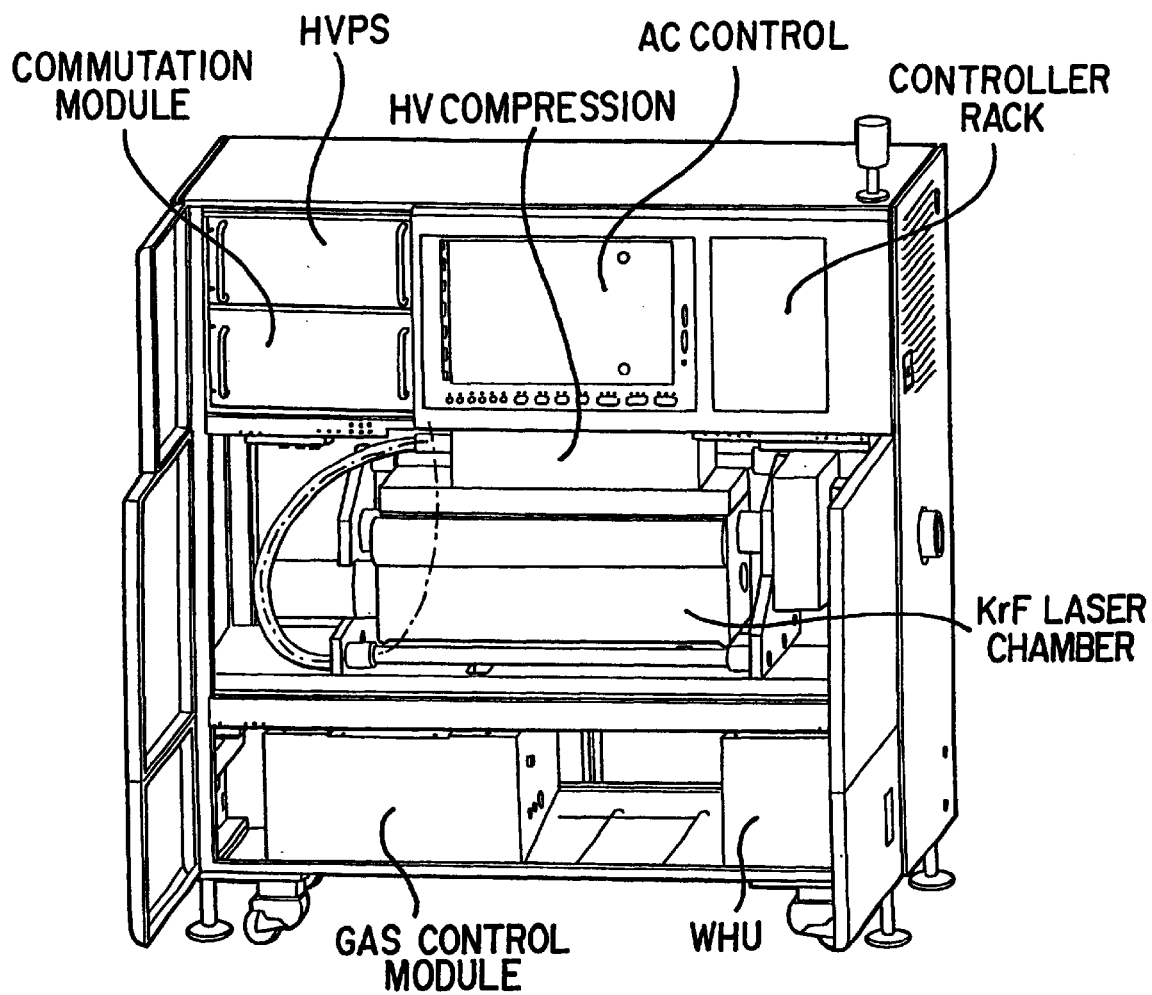
FIG. 1 is a drawing of a prior art commercial excimer lithography laser.
Figure 1A:
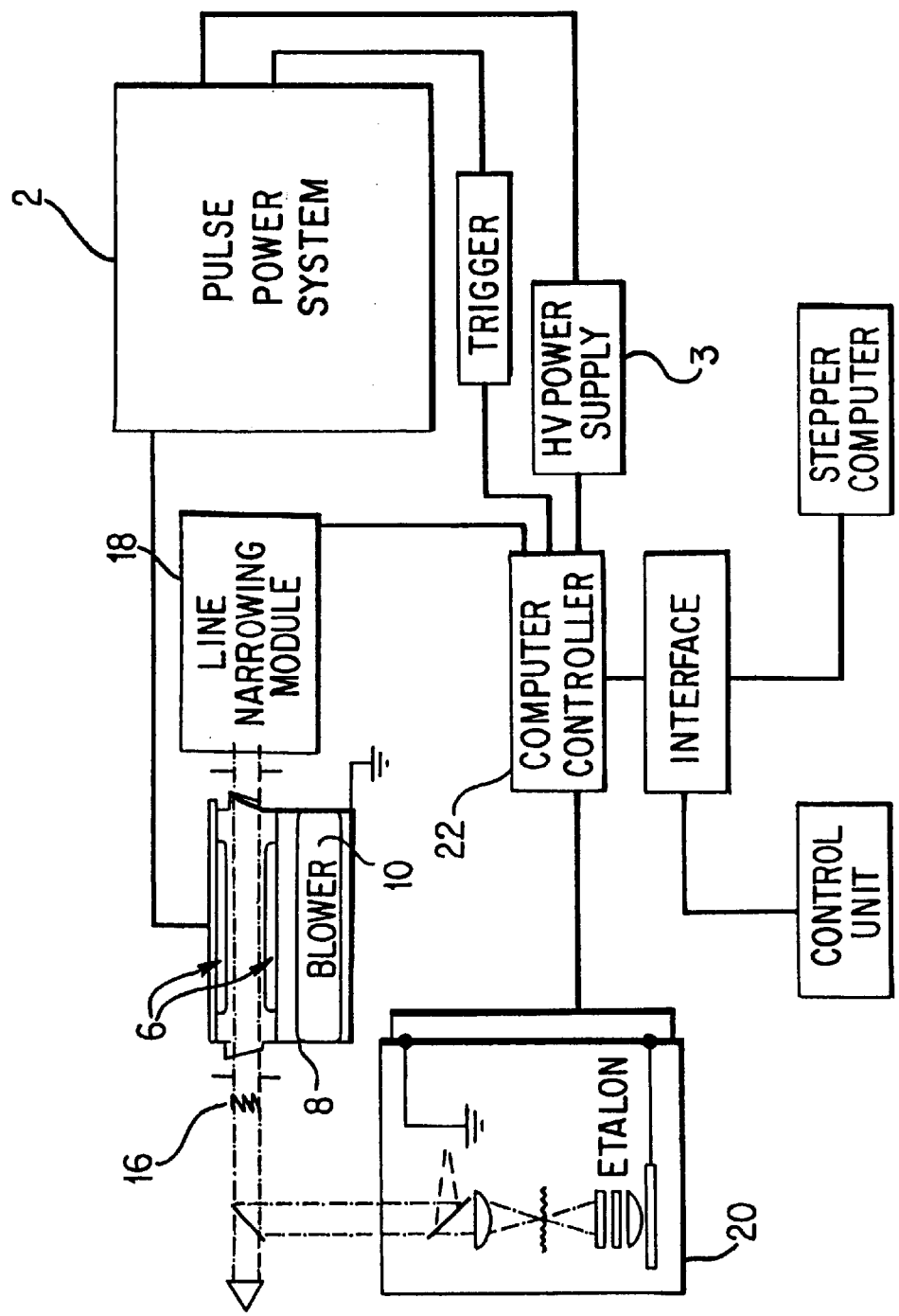
FIG. 1A is a block diagram showing some of the principal elements of a prior art commercial excimer lasers used for integrated circuit lithography.
Figure 1B:
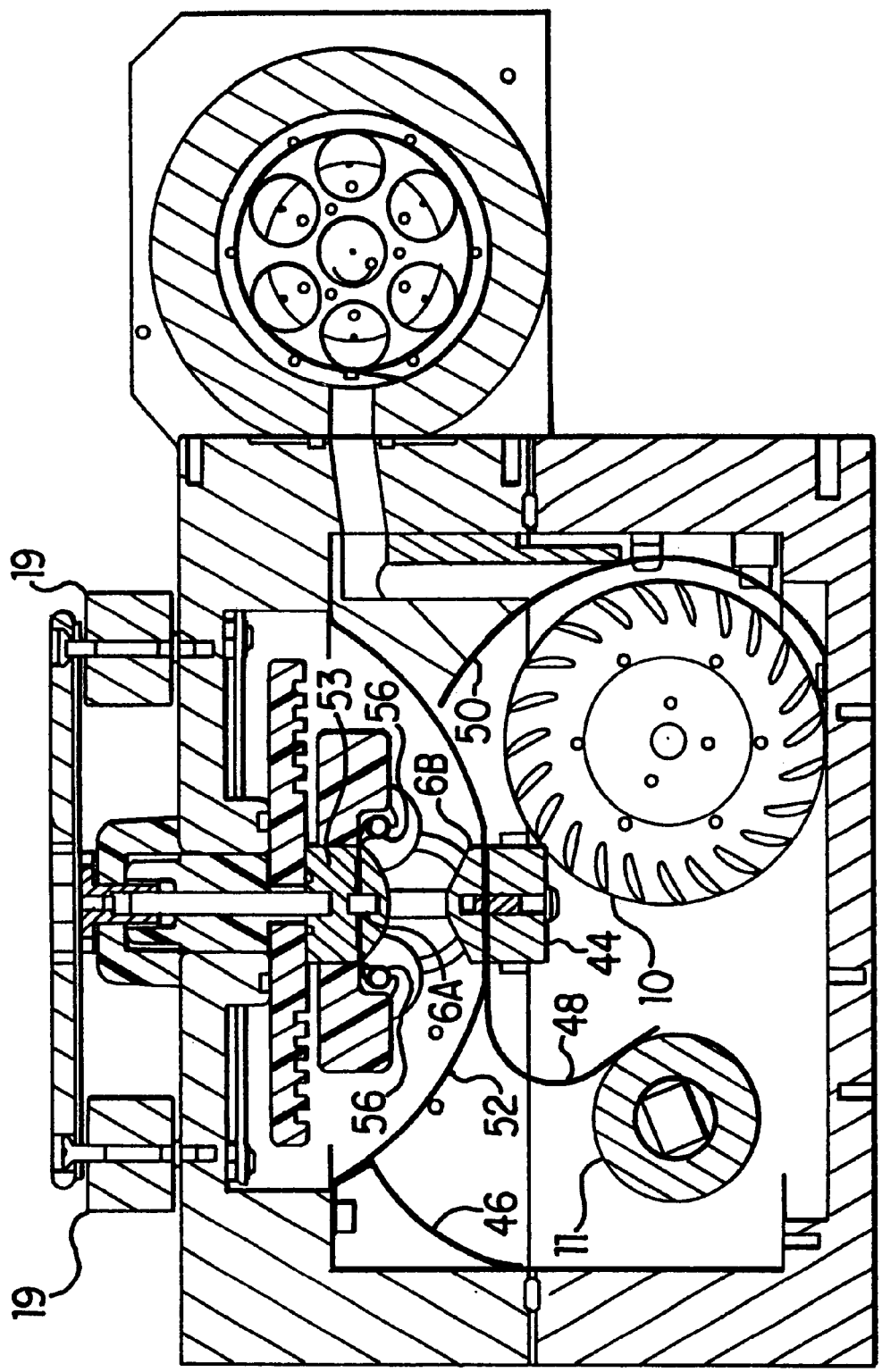
FIG. 1B is a drawing of the laser chamber of the FIG. 1 laser.
Figure 2:
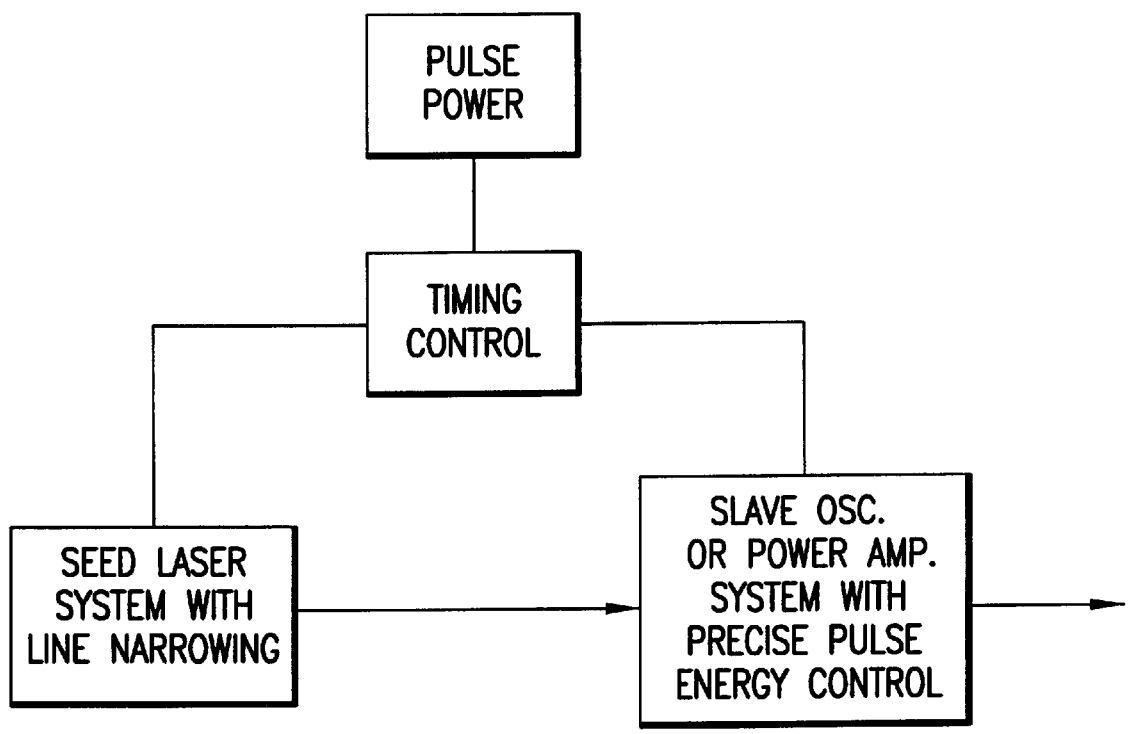
FIG. 2 is a block diagram showing features of the present invention.

FIG. 14D1 and FIG. 14D2 are plots which show that the pressure shift coefficient for a He Ne mixture is a simple weighted sum of the pure gas shift coefficient so that the shift for the mixture is equal to:

Shift (mixture)=(1.84 fm/kPa)(% He)+(0.81 fm/kPa)(% Ne)

FIG. 14E shows the variation in center wavelength with $F_2$ partial pressure measured wit ha 500 kPa He buffer and at 850 v charging voltage. The $F_2$ induced centerline shift is about −20 fm/kPa $F_2$ pulse energy at constant charging voltage is affected by changing the $F_2$ partial pressure as shown by the energy plot.

Figure 14F:
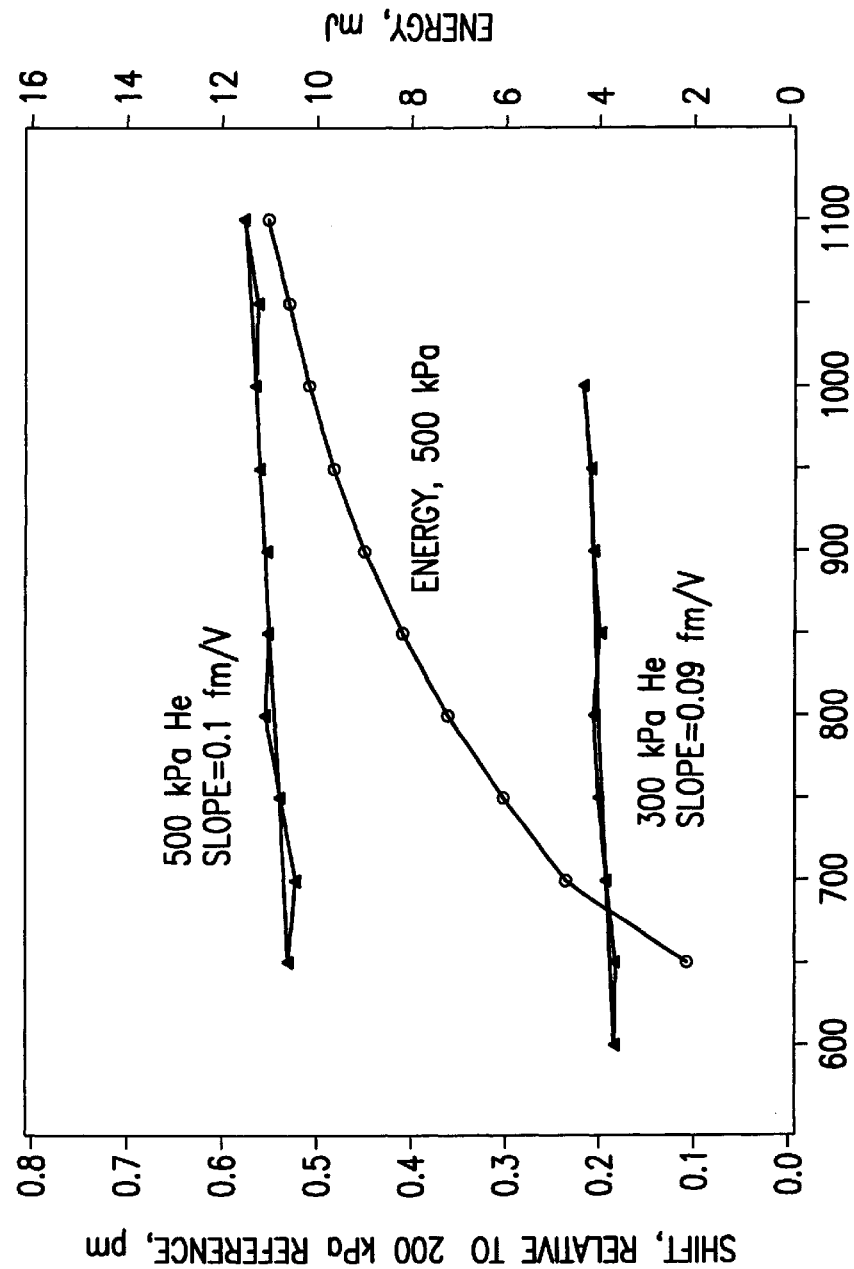

FIG. 14F compares the effect of voltage change on centerline shift at laser gas pressures of 300 kPa and 500 kPa. The result is about 0.1 fm/v in both cases.

Figure 14G:
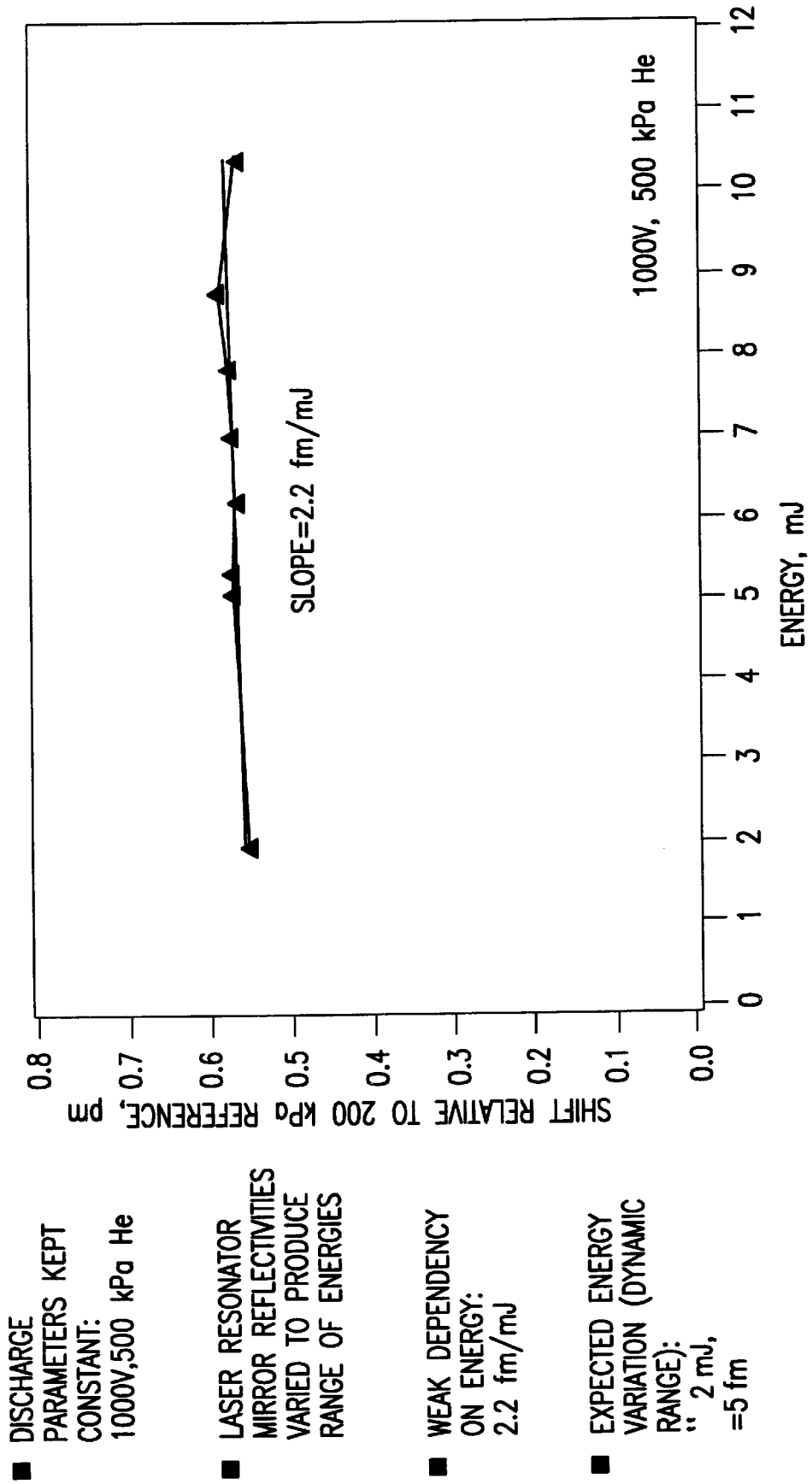

Applicants varied resonator mirror reflectivity with all other parameters constant to try to obtain a variation of centerline with pulse energy. The result is about 2.2 fm/ml as shown in FIG. 14G.

Figure 14H:
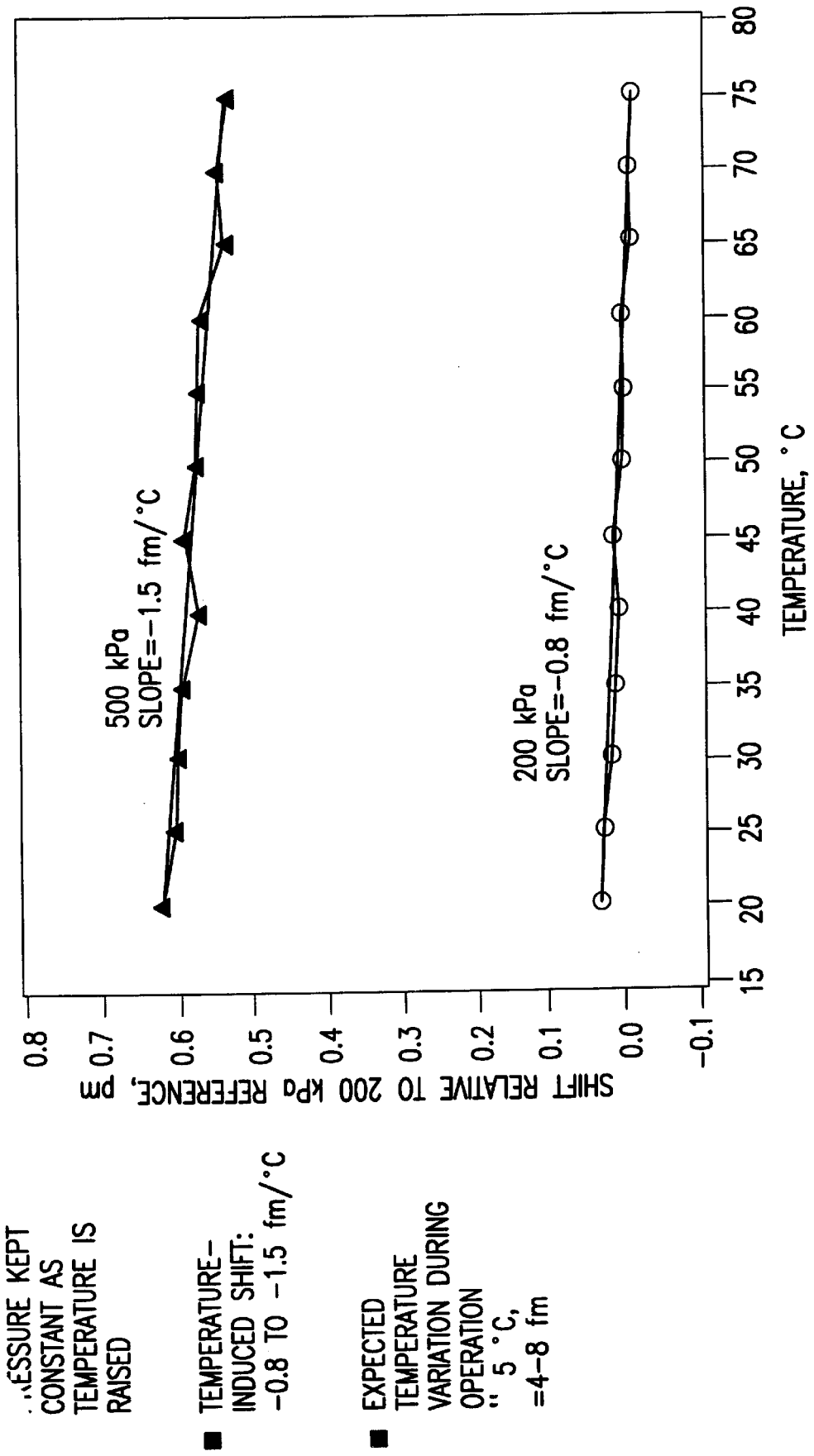

The variations of centerline shift with temperatures at 500 kPa and 200 kPa are shown in FIG. 14H. The results varied from −0.8 to 01.3 fm/° C.

A summary of all this text data is set forth below in Table I.

Table I

Summary of F2 Laser Center Wavelength Data

| Absolute wavelength (D2 reference spectrum, 200 kPa He buffer): | |
|---|---|
| Strong line: | 157.63090 nm |
| Weak line: | 167.52418 nm |
| Pressure shift coefficients: | |
| He: | 1.84 fm/kPa |
| Ne: | 0.81 fm/kPa |

Table I-continued

Summary of F2 Laser Center Wavelength Data

| | | |
|---|---|---|
| Zero pressure wavelength: | | 157.63053 nm |
| Central wavelength at arbitrary helium/neon buffer: | | |
| $\lambda = 157.63053 + 1.84 \times 10^{-6} P_{He} + 0.81 \times 10^{-6} P_{Ne}$ <nm> | | |
| Parametric sensitivities: | | Expected effect |
| HV: | 1 fm/V | 20 fm |
| $F_2$: | −20 fm/kPa $F_2$ | 1 fm |
| Temperature: | −0.6 to −1.3 fm/° C. | 4–8 fm |
| Energy: | 2.2 fm/mJ | 5 fm |

Applicants' Summary Conclusion from These Tests are:
1) The determination of a "zero pressure" wavelength and pressure shift coefficients allows for a universal specification of the central wavelength.
2) The central wavelength can be inferred to sufficient accuracy that a wavemeter is not needed.
3) Variability in the central wavelength of the $F_2$ laser, due to normal changes in laser operating parameters, appears limited to ±0.02 pm

Injection Seeded $F_2$ Laser System

Seed Laser

FIGS. 2 through 11D describe various techniques for designing and operating injection seeded $F_2$ laser systems. A preferred first $F_2$ injection seed light source may be a conventional $F_2$ laser, using either a plane-parallel optical resonator, or an unstable resonator configuration. The pulse power supply for both laser subsystems is preferably provided utilizing one of the techniques described above. This assures that the timing of the discharge of each laser subsystem is adequately synchronized. In a preferred $F_2$ embodiment the seed laser beam is filtered downstream of the seed laser. The seed laser preferrably will generate enough energy such that, after filtering, 10–100 µJ of narrow-band.energy is available for seeding the $F_2$ power gain stage. An unstable resonator will produce a lower divergence, more spatially coherent beam than a stable resonator, which may be of some advantage in coupling energy through the injection spectral filter. For instance, if the filter is a simple monochromator, a lower divergence beam will be more easily focused down to the input slit of the monochromator. Another design option is to operate the first $F_2$ light source laser at relatively low pressure (≈100–200 kPa). This produces a substantially reduced spectral width: 0.3–0.6 pm. A lower spectral width means a greater fraction of the energy entering the post gain filter will make it through the filter. The raw output energy from the first $F_2$ light source will be much lower, but this may not be a practical disadvantage because the maximum energy that the injection filter can handle is similarly limited.

A conventional $F_2$ laser for use as the first $F_2$ light source in a preferred embodiment a standard KrF lithography laser system modified for operation as a $F_2$ laser. These KrF lithography lasers are well known and there are more than 1,000 of these units operating today in integrated circuit fabrication plants as light sources for integrated circuit lithography machines. These lasers produce laser pulses at rates in the range of 1000 to 2000 pulses per second and are available from suppliers such as Cymer, Inc. with offices in San Diego, Calif. These lithography lasers are described in detail in many patents such as U.S. Pat. No. 5,991,324 and U.S. Pat. No. 6,128,323 both of which are incorporated herein by reference. The major modifications needed for operation as an $F_2$ laser are to change the gas mixture to about 0.1 percent fluorine and the remainder helium (although a neon or a combination of helium and neon could be used) and preferably the upper range of the discharge voltage is increased from about 26,000 volts to about 36,000 volts. A basic prototype $F_2$ laser system used for both the first $F_2$ light source and the power gain stage is described below in the section entitled "$F_2$ Laser System Designs". That section describes the significant improvements to the prior art KrF laser system to produce an $F_2$ laser.

Pre-Power Gain Filter

Figure 6:
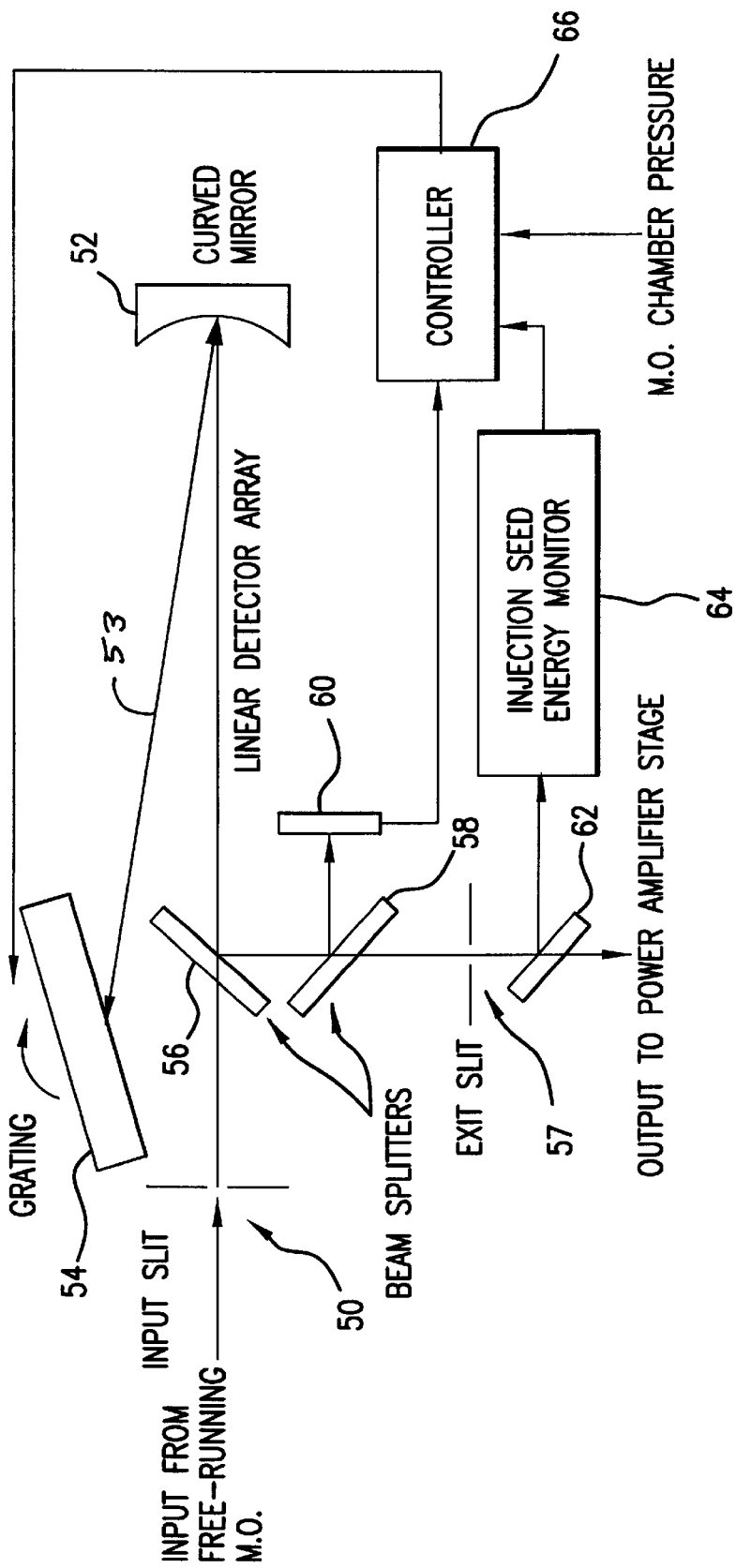
FIGS. 6 and 6A show features of a first grating monochromator.
Figure 6A:
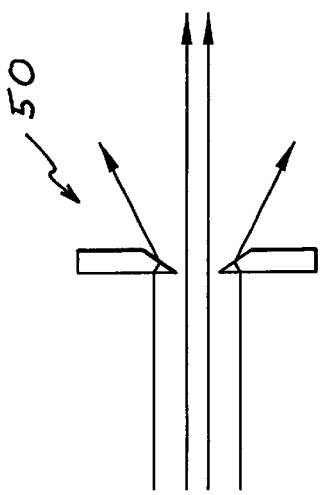

A preferred conventional grating-monochromator pre-power gain filter is described by reference to FIG. 6. This filter, when used with a free-running $F_2$ laser as the master oscillator, preferably must slice out a 0.1 pm bandwidth portion of the free-running spectrum from the master oscillator, and be capable of producing the 10–100 µJ of narrow-band energy required by the following amplifier stage. This first filter embodiment shown in FIG. 6 is that of a conventional grating monochromator. Light from the master oscillator is first focussed down onto an input slit 50. Light passing though the input slit is collimated preferably by a curved mirror 52, which may be a simple spherical mirror, or an off-axis paraboloid, and the collimated light is directed to a grating 54. The grating is a high dispersion type (e.g. an echelle grating) chosen to disperse light in the 157 nm wavelength range. The grating is in the Lithrow configuration. Light at a selected very narrow range which is reflected back along the beam path 53 is re-imaged on an exit slit 57 with the aid of beam splitter 56. The various geometric and optical parameters of the arrangement (i.e. slit widths, grating dispersion, curved mirror focal length) determine the bandwidth of the light leaving the exit slit. One design problem that must be overcome is the high peak intensities that are reached at the input and exits slits when one attempts to couple the desired amount of energy through the monochromator. One method to handle these high intensities is to use refractive slits, i.e. knife edge wedges that refract the unwanted light into another direction, without absorbing the energy. Such a slit arrangement is shown in FIG. 6A.

In addition to its function as a filter, the arrangement of FIG. 6 includes an additional beamsplitter 58 and a linear detector array 60 placed at an exit image plane. This addition solves an important remaining problem: how to maintain the (tunable) injection filter at the desired wavelength. If the grating angle is in error by more than a few 10's of micro-radians, the seed beam will miss the exit slit, and there will be no narrow-band energy to lock the following power amplifier stage. If the angle is very slightly incorrect the amplified spectrum will not be at the desired wavelength. Fortunately, the monochromator can, in essence, monitor itself. The image formed by the grating and curved mirror is the dispersed spectrum of the light entering the monochromator. The second beam splitter produces two identical images (spectra), one at the exit slit, and one at the linear detector array. The linear detector array senses the relatively.broad spectrum from the free-running master oscillator and converts it into a video signal representative of the spectral intensity at each point on the array. Since the free-running wavelength is stable and well-known, it serves as a calibration standard for the monochromator. A controller 66 reads out the linear detector array, and adjusts the grating angle so as to place the image of the spectrum centered at a desired point on the array, near the center for example. In this way the monochromator is self-stabilized to the free-running spectrum of the master oscillator. Since the exit slit and linear array are basically duplicate image planes, the exit slit position corresponds to a particular position, and hence wavelength, on the linear array. Therefor, with the free-running spectrum from the master oscillator as a spectral reference, the wavelength of the light leaving the exit slit can be precisely determined.

One method for calibrating this arrangement is to place a beamsplitter 62 in the path of the beam exiting the monochromator and to monitor the beam energy with energy detector 64. Such a detector is desirable in any event, since the energy of the injection seed needs to be monitored.

Calibration

A calibration sequence would proceed as follows: (1) With the grating at a starting angle, the laser is fired and the output energy from the exit slit is monitored, along with the spectral image falling on the linear array. The peak of the spectrum is determined in terms of the position, in pixels, on the array. (2) The grating angle is incremented and the measurements are repeated. (3) After the grating angle is scanned though a range, the resulting data is examined. The position of the spectrum on the array (in pixels) where the output energy maximizes corresponds to the equivalent position of the slit.

Once this calibrated position is determined, the known dispersion of the monochromator can be used to retune the grating to other wavelengths. For instance, suppose the monochromator dispersion is 0.1 pm/pixel, and further suppose the calibrated position of the exit slit is pixel 300. If the desired wavelength of the output is 157.6299 nm (157,629.9 pm), the center of the free-running spectrum, then the grating angle is adjusted so that the center of the image falls at pixel 300. If the desired wavelength is +0.2 pm away from the center (157.6301 nm), then the grating would be moved so that the center of the image would fall at pixel 302. A further refinement is to include the pressure of the master oscillator in the calibration and subsequent use of the monochromator, since the center of the free-running spectrum is pressure dependent. This pressure dependence must be included in the calibration, especially if the pressure of the master oscillator is allowed to vary significantly. We have determined that the center wavelength of the free-running laser has a pressure shift coefficient in the range of about 1 to 2 fm/kPa, when helium is used as a buffer. For any given pressure, a good estimate of the wavelength is therefor 157.6309+0.00000192*P nm, where P=pressure in kPa. Other pressure shift coefficients can be used if other buffer gasses are used (neon for instance, or mixtures of helium and neon).

Modified Grating Monochromator

Figure 7:
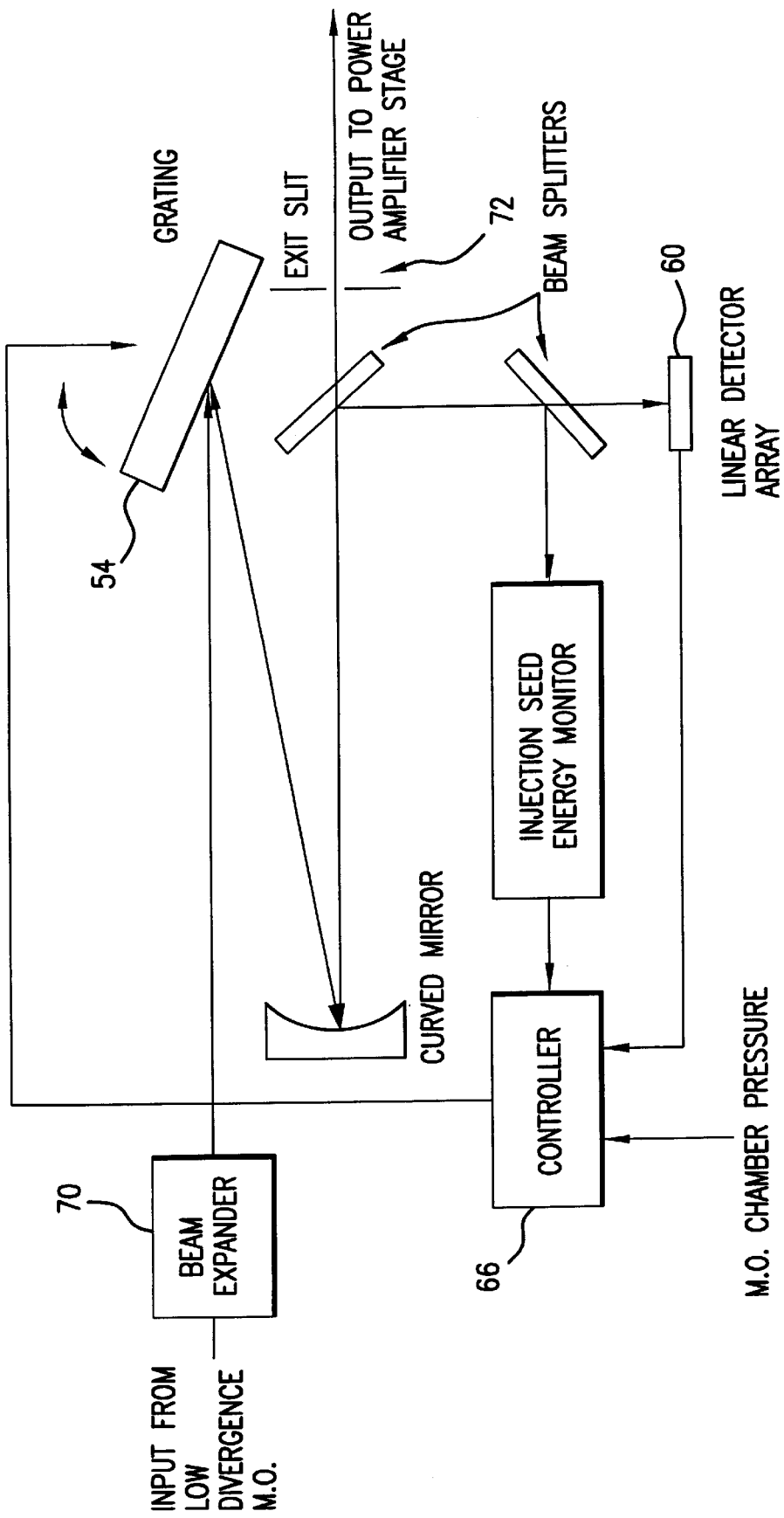
FIG. 7 shows features of a second grating monochromator.

An alternate method for producing the narrow-band light is with a modified grating monochromator as shown in FIG. 7. This filter filters the output beam of a master oscillator which produces a well-collimated, nearly diffraction limited coherent beam, and in this case we eliminate the entrance slit of the monochromator.

A beam expander 70 is used to reduce the divergence from the master oscillator and to physically match the size of the beam from the master oscillator to grating 54. The dispersed light from the grating is focussed via a curved mirror (or lens) to an exit slit 72 where the desired wavelength is selected. The operation of the linear detector array 60 and controller 66 is the same as previously described. The advantage of this arrangement is that it eliminates the need for an entrance slit and the associated problems with high peak intensities. This arrangement has a disadvantage in that the pointing stability of the master oscillator is now a factor in the position of the image on the array, and hence the wavelength selection process. For slowly varying changes in the input angle from the master oscillator, the controller can retune the grating and keep the wavelength constant.

Etalon Filter

Figure 8:
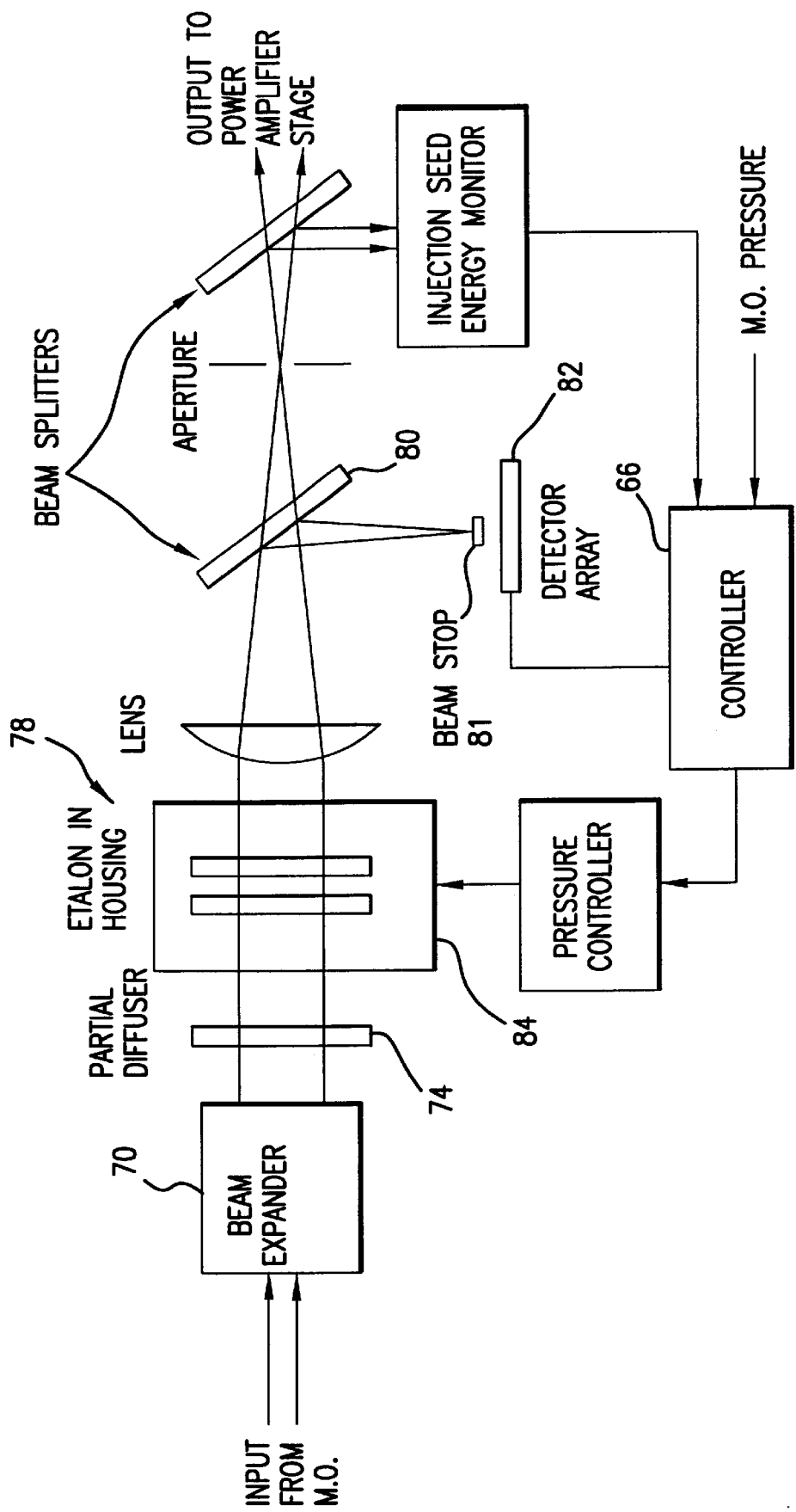
FIG. 8 shows features of an etalon filter.

An etalon 78 can also be used as a bandpass filter as shown in FIG. 8. As with the monochromator filters, it is desirable that the etalon be self-referenced to the free-running spectrum of the master oscillator, which is used as an atomic standard. The beam from the master oscillator is first expanded with beam expander 70, both to lower its divergence and to reduce the power density on the etalon. After expansion, the beam passes through a special "partial diffuser" 74, an optical element which transmits most of the light unaltered, but scatters a small faction into a range of angles. Examples of this are diffractive optics with low diffraction strength, or very lightly and finely ground optical flats. The light then passes through the etalon at near normal incidence. The etalon's bandpass characteristics are determined by its free spectral range (FSR) and finesse. For instance, an etalon with an FSR of 2 pm and a finesse of 20 will have a bandpass of 0.1 pm FWHM. The etalon will then transmit a 0.1 pm slice of the spectrum from the free-running master oscillator. As with the monochromator, it may be advantageous to operate the master oscillator at low pressure, and hence reduced bandwidth, in order to limit the power loading on the etalon. In addition, a narrower starting spectrum will reduce the amount of energy in the adjacent transmission orders of the etalon (±1 FSR from the central wavelength). After passing through the etalon, a lens 76 (or curved mirror) focuses the light to a point, where an aperture is placed. A portion of the beam is split off by beam splitter 80 and monitored by a photodiode array 82 which provides center wavelength and bandwidth signals to controller 66 which uses this information to control the etalon 78. The purpose of the aperture is to block all light except the on-axis, non-diffused component of the beam. This light, which is narrow-band, is then sent on to the power amplifier stage. A beam splitter and optical detector follows the aperture, to monitor the energy leaving the injection filter.

In general, the central wavelength of the etalon's bandpass will not align with the center of the spectrum of the free-running master oscillator. The etalon needs to be tuned. Four methods are possible, depending on whether the etalon is a solid plate type or an air-spaced type. For solid etalons, the etalon can be tilted with respect to the incoming beam, or the temperature of the etalon can be varied, which effectively changes the optical thickness of the plate. For air-spaced etalons, the angle can be varied, the plate spacing can be varied (by PZT actuators, for instance), or the index of refraction of the gas between the plates can be varied by changing the density of the gas.

In a preferred embodiment, the etalon is an air-spaced type which is enclosed in a pressure-tight housing 84 as indicated in FIG. 8. A pressure controller is used to vary the pressure of the gas within the housing (at constant temperature), thereby pressure tuning the etalon. Since the amount of tuning required is very small (about ±0.2 to ±0.5 pm), the pressure change that is needed is also very small, about ±3 to ±8 torr with nitrogen as the gas. This can be achieved either by changing the volume of the (sealed) housing, or by actively introducing or withdrawing gas from a suitable supply. As the etalon is pressure tuned, the output intensity will alternately increase and extinguish as the bandpass wavelength sweeps through the spectrum from the free-running master oscillator.

Control over the tuning of the etalon is attained by including additional optical elements that turn the etalon into its own etalon spectrometer. An additional beamsplitter is located prior to the exit aperture, and forms a second focal plane of the lens. In this focal plane (as in the first), the intensity distribution consists of an intense spot at the center of focus plus a much weaker conventional etalon ring pattern. The intense spot is formed by the non-diffused portion of the beam passing through the etalon, whereas the etalon ring pattern is formed by the diffused portion of the beam. The intense central spot is not used here and is blocked with a beam stop 81. A linear detector array 82 is then placed in the focal plane to read out the etalon ring pattern. This arrangement is very similar to the design of current wavemeters used in lithographic lasers. For a given optical arrangement, there is a direct relationship between the diameters of the etalon rings and the central wavelength of the etalon bandpass.

Calibration of the arrangement is done in a manner similar to the procedure previously described for the monochromator filter. A calibration sequence would proceed as follows: (1) With the etalon pressure-tuned to a starting wavelength, the laser is fired and the output energy from the exit aperture is measured, along with the etalon ring pattern falling on the linear array. The diameter of the innermost, fully formed ring is determined. (2) The pressure controller increments the pressure in the etalon, and the measurements are repeated. (3) After the etalon is pressure-tuned through one free-spectral range, the resulting data is examined.

The diameter of the innermost ring where the output energy maximizes corresponds to the condition where the bandpass of the etalon is exactly tuned to the peak of the free-running spectrum from the master oscillator which is pressure dependent.

Once this calibrated diameter is determined, the wavelength of the etalon bandpass filter can be stabilized by varying the pressure in the etalon so as to maintain this diameter. As a further refinement, the etalon ring pattern can be converted directly into a "wavelength" by employing the same non-linear etalon equations used in the lithographic wavemeters. This allows the bandpass function to be detuned from the peak of the master oscillator spectrum by a known amount. A further refinement is to include the pressure of the master oscillator in the calibration and subsequent use of the etalon, as has been previously described.

Tuning

Normally the narrow spectral band (of about 0.1 pm or less) chosen for operation of the laser system will be the narrow band meeting desired bandwidth specifications with the maximum output pulse energy. However, a limited amount of wavelength tuning is possible with the pregain filters described above. Applicants expect that a tuning range of at least about 1.2 pm can fairly easily be achieved. Additional tuning is feasible with some significant compromise of output pulse energy. The tuning range is a function of laser gas pressure as indicated above. Therefore a longer overall range can be achieved by adjusting the pressure in the laser.

Power Gain Stage

Two preferred power gain stages can be described by reference to FIGS. 9 and 10.

Power Oscillator

The power gain stage can be configured as a power oscillator as shown in FIG. 9. Many different resonators can be used for the PO design, depending on the desired output. In a preferred embodiment, the resonator is an off-axis hybrid unstable resonator, formed by two split-coated mirrors, all as shown in FIG. 9.

The injected seed beam 90 is aligned to a central axis along the top of an unstable resonator 92, and first travels through a 50% partial reflector 93A. The rear resonator optic 94 is a zero power meniscus type, which does not disturb the collimation of the injected beam. The injected beam fills the Fresnel core of the resonator, establishing control over the intercavity field (the Fresnel core in this case is the volume formed between 50% R mirror 93A and 100% R mirror 94A). After propagating with amplification to the front optic, the beam is reflected from the 100% reflective, convex surface. The beam expands and is amplified as it travels to the rear optic, where a portion reflects off of the 100% reflective, concave surface 93B and a portion reflects off surface 93A. This re-collimates the beam, which is further amplified by a third pass through the gain. The lower portion 94B of the output coupler is anti-reflective coated, allowing the beam to exit with minimal loss. As with the rear optic, the front optic is a zero-power meniscus type, to preserve the collimation of the output beam. This type of a resonator forms a power oscillator because the 50% and 100% reflective surfaces provide feedback into the Fresnel core of the resonator. The advantage of this type of resonator is (1) there is no central obscuration or hole in the beam, and (2) it requires very little seed energy to lock the power oscillator to the seed.

Power Amplifier

A power gain stage in the form of a power amplifier is shown in FIG. 10. In this case the resonator is similar to the one shown in FIG. 9 except the feedback has been eliminated by changing the 50% reflective surface 93A to an anti-reflective surface 93B. This configuration produces an off-axis, multipass power amplifier.

$F_2$ Laser System Designs

Several prototype $F_2$ laser systems have been built and tested by Applicants and their fellow workers to serve as gain media for both as the first $F_2$ light source, and as the power gain stage.

These systems are largely based on current production KrF and ArF lasers incorporating several important improvements over prior art excimer laser systems, utilizing a high efficiency chamber and solid-state pulsed power excitation. The discharge is corona pre-ionized to minimize gas contamination. The entire optical beam path is nitrogen purged to avoid light absorption by oxygen and to avoid damage to optical components. All resonator optics were external to the angled chamber window equipped laser chamber. The gas mixture was 0.1% fluorine in 4 atmospheres of helium and the electrode gap was reduced to 10 mm.

Figure 3:
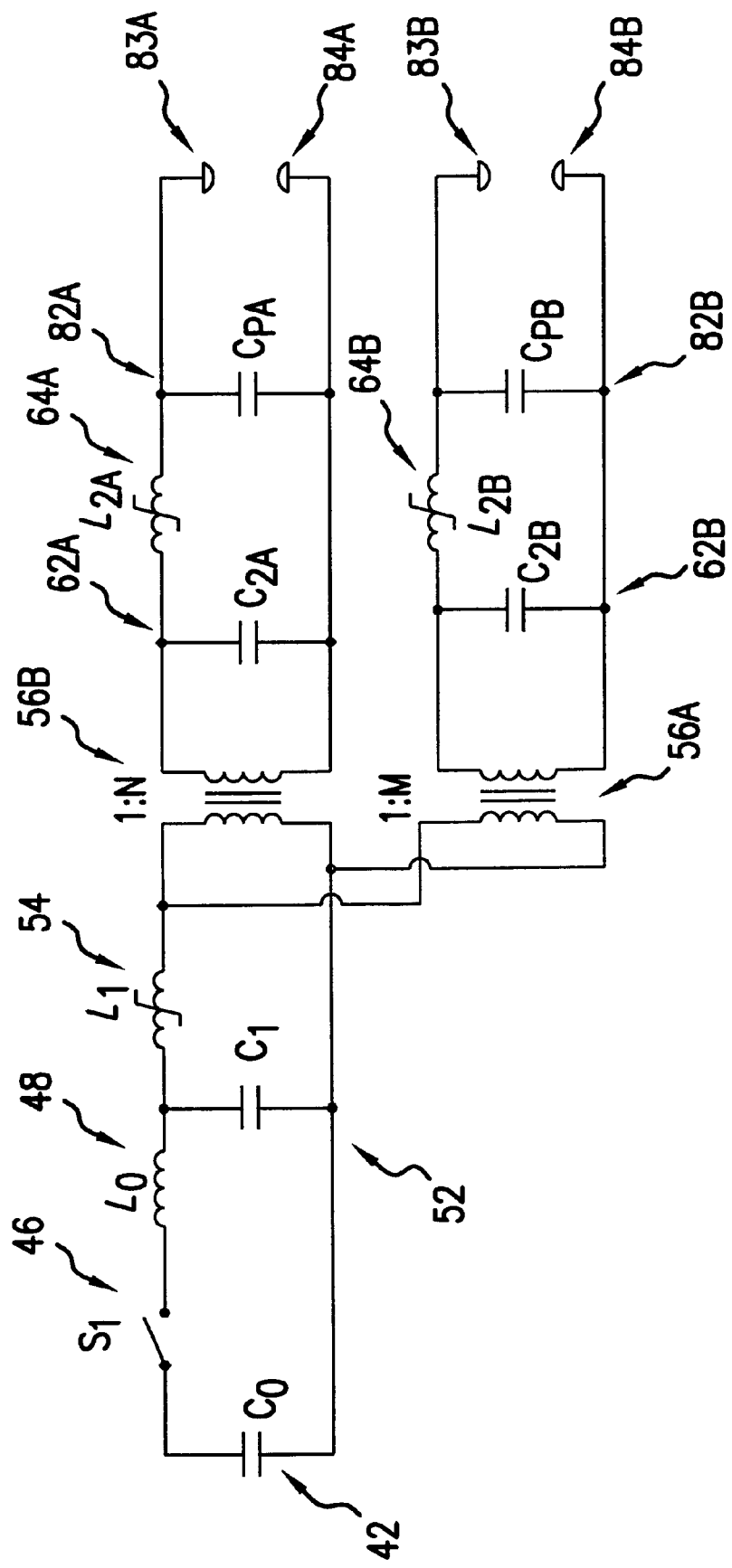
FIG. 3 is an electrical circuit drawing showing features of a preferred embodiment of the present invention.
Figure 11:
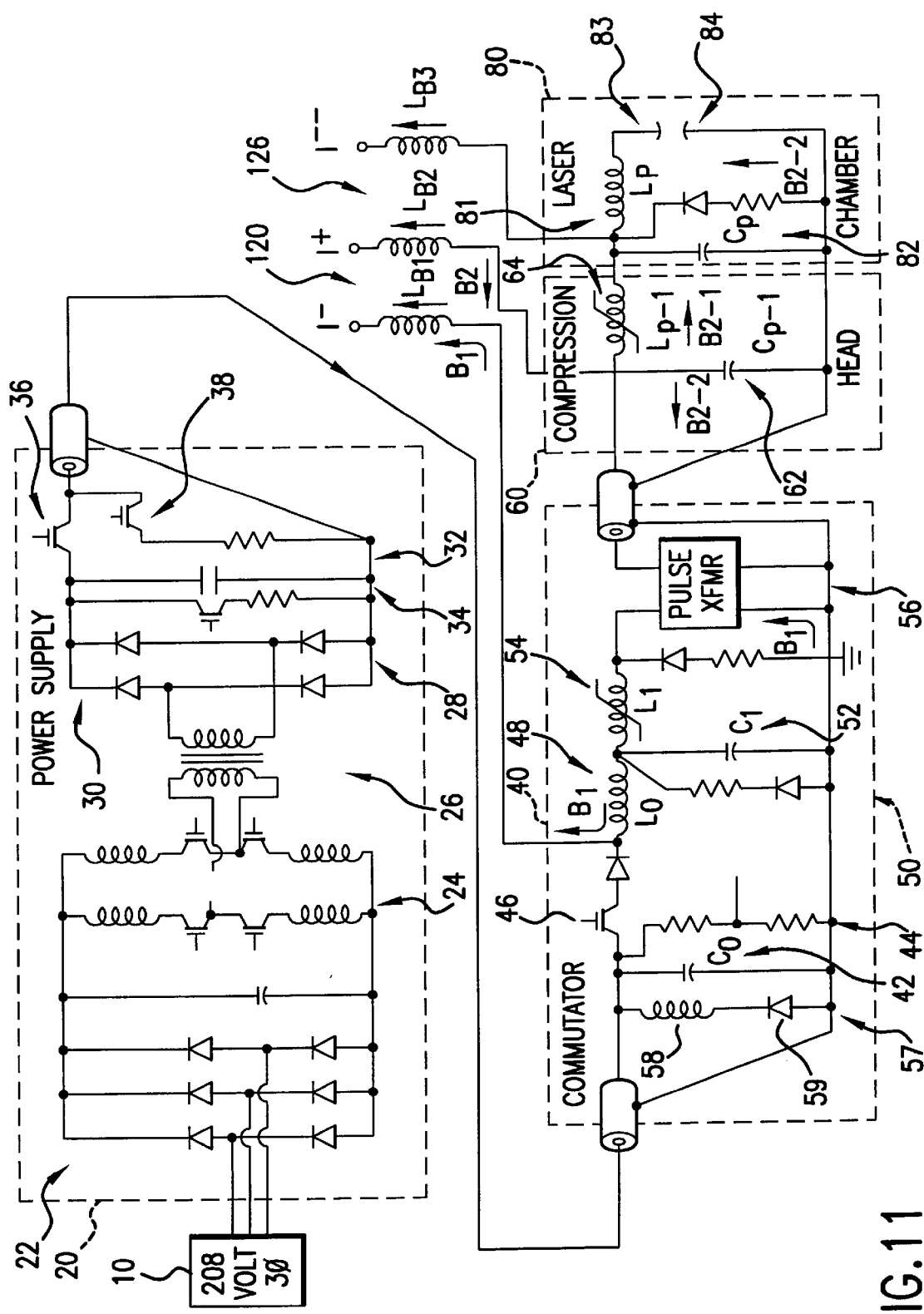
FIGS. 11, 11A, 11B, 11C and 11D show features of a pulse power system.
Figure 11A:
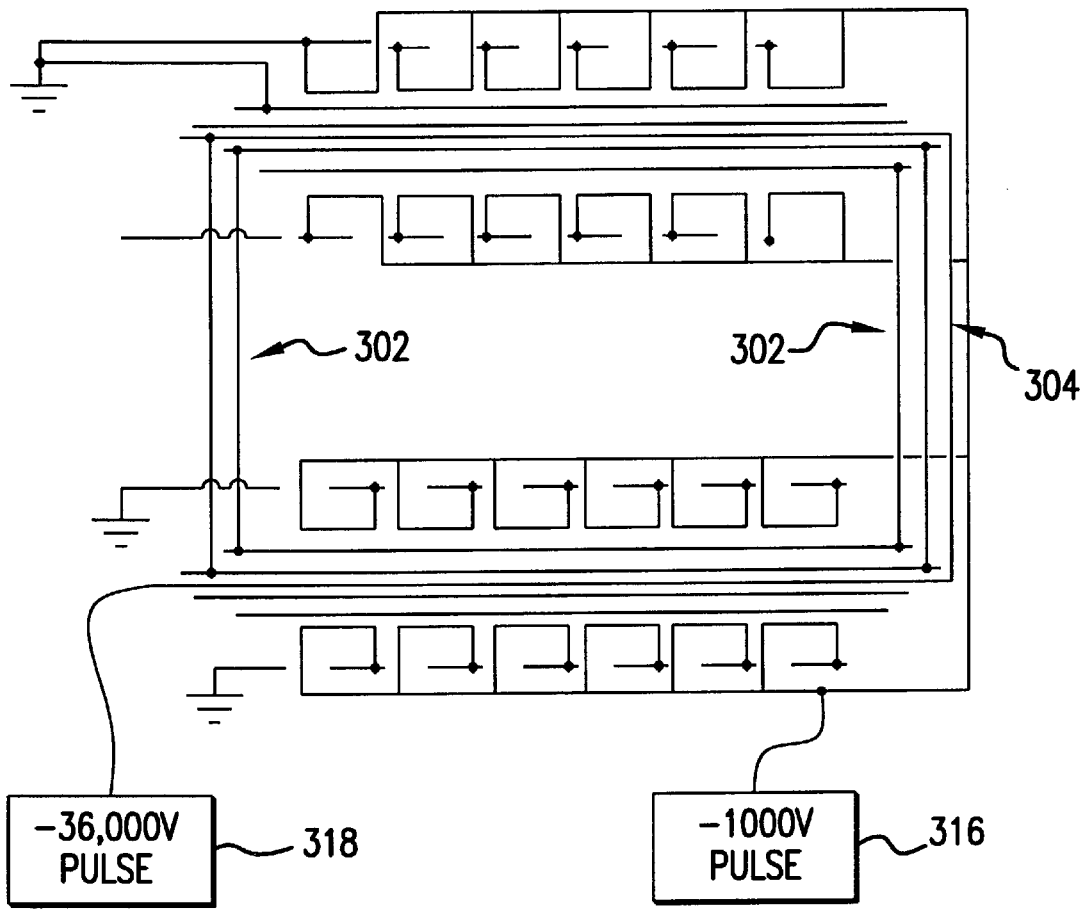
Figure 11B:
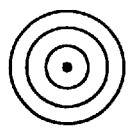
Figure 11C:
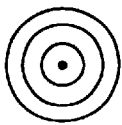
Figure 11D:
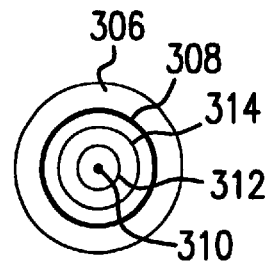
Figure 12:
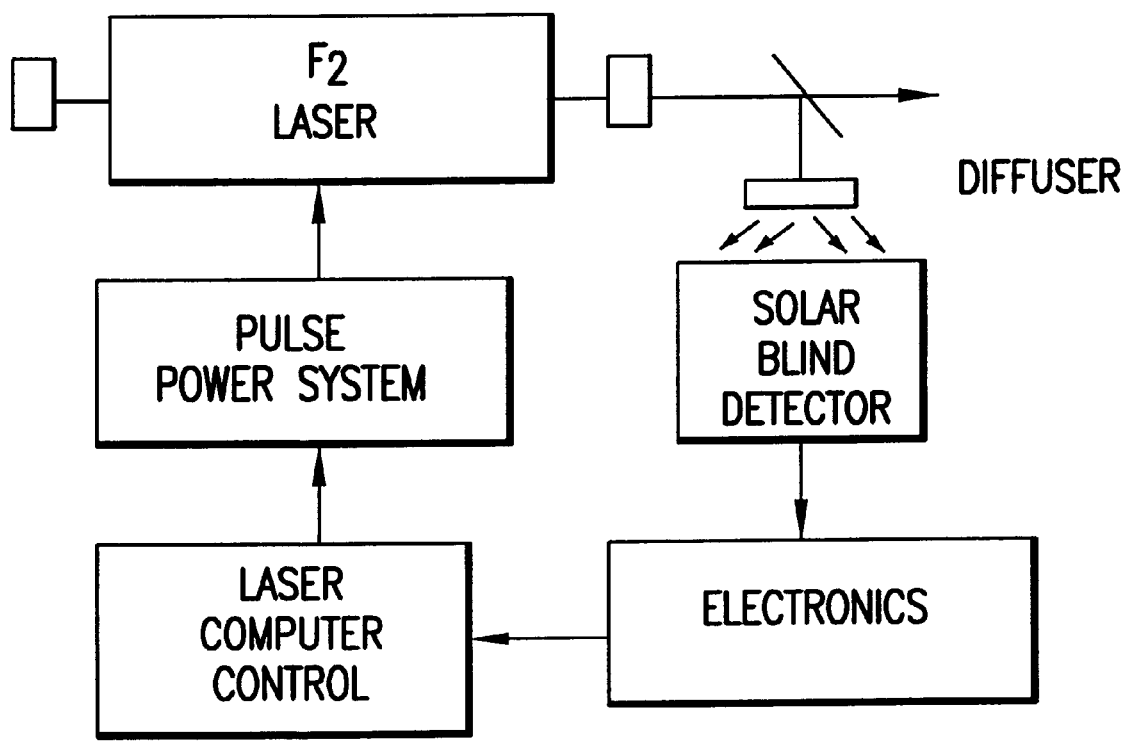
FIG. 12 shows a pulse energy detector in a feedback control system.

In these prototype units, for both the first $F_2$ light source and the power gain stage, a modified pulse power system is used and a circuit diagram for the system is shown in FIG. 11 and in FIGS. 2 and 3. The major difference between the pulse power system for these embodiments and corresponding systems for prior art KrF lasers is the pulse transformer 56 which for the $F_2$ laser provides higher output voltage and, as described above, the portion of the circuit upstream of the transformer is a single circuit and the portion downstream of the transformer is a divided circuit. In this pulse transformer the single four-section stainless steel rod (described in U.S. Pat. No. 6,128,323 referred to above) which functions as a secondary winding is replaced by a transformer secondary conductor consisting of an inner cylindrical rod and two coaxial tubes all connected in series and insulated from each other as shown in FIGS. 11A, 11B and 11C. The secondary conductor consists of two coaxial assemblies (the cross-section of which are depicted in FIGS. 11B and 11C) connected with bus bar as shown at 302 and HV cable as shown at 304. FIG. 11D shows the same cross-sections as 11B and 11C and also the layers 306 of Metglas™ and mylar film which is wrapped around the cylinder portion 308 of the spools forming the primary winding. Also identified in FIG. 11D are the central wire 310 and hollow cylindrical conductors 312 and 314 forming the secondary portion of the pulse transformer. The Metglas™ and mylar layers are not shown in FIGS. 11A, 11B and 11C. A current pulse having a voltage peak of about 1,000 volts (as indicated at 316) will produce a pulse at the secondary HV terminal of about 36,000 volts as indicated at 318 in FIG. 11A. Thus, each of the two pulse transformer sections feeding the two lasers, is comprised of 12 induction units (instead of the 23 shown in FIG. 3HB). However, the three secondary conductors passing through the 12 induction units produce voltage amplification of 36.

Coupling between the primary cylinders and the three coaxial secondary conductors is provided by wrappings of Metglas™ and mylar film as described above with reference to FIG. 8E. In this embodiment an extra stage of compression (with one additional capacitor bank $C_{p-1}$) is provided. The capacitor banks in this embodiment have the following values:

| | |
|---|---|
| $C_0 =$ | about 12.1 µF |
| $C_1 =$ | about 12.4 µF |
| $C_{p-2} =$ | about 8.82 nF |
| $C_{p-1} =$ | about 8.4 nF |
| $C_p =$ | about 10 nF |

The modified pulse power system in this prototype embodiment produces an output rise time of about 80 ns into the peaking capacitor bank. The step-up ratio of the pulse transformer is 36× (as compared to the 24× in the embodiment described in: detail above). This permits the laser to operate at substantially higher voltages with correspondingly lower $F_2$ concentrations as compared to the unmodified pulse transforms. Applicant has determined that the higher voltage operation improves discharge stability, and permits higher repetition rates. As explained above, in this embodiment two separate transformers are provided each of which are supplied by a primary current from a common source as shown in FIG. 3B but each of the transformers are configured a shown in FIGS. 11A, B, C and D to provide a 36× step up instead of the 24× as shown in FIG. 3B.

Post Output Filter

As indicated above, the output of power gain stage of preferred embodiments of the present invention will have ultraviolet bandwidths of about 0.1 pm or less with a line center within the nominal $F_2$ 157.63 nm line which covers a spectral range of about ±0.5 pm around the nominal wavelength. As indicated in the following section, a small amount of light energy in other spectral ranges are produced in $F_2$ lasers especially red and infrared light when helium is used. If this red light is a problem, it can be easily eliminated with well know optical filters designed to transmit 157 nm UV light and absorb or reflect away (not back into the laser) the red light. Also, a post output filter of one of the types described above could be added to further line narrow the output beam in the UV range. However, when used as a post output filter, the components of the filter need to be designed to handle a much higher energy beam.

Pulse Timing

Preferred embodiments of the present invention utilize a pulse power system configured to control the timing of the discharge of the two laser systems to produce desired output pulse laser beams. These embodiments make use of a fractional turn pulse transformer design similar to fractional turn pulse transformer described in U.S. Pat. No. 5,142,166. In these embodiments the portion of the pulse power circuits for the two laser systems are separate downstream of the pulse transformer system and portions of the pulse power circuits upstream of the pulse transformer system is common for both laser systems.

FIG. 3 shows an electrical outline of the principal elements of a preferred pulse power system. The portion of the system upstream of the pulse transformer system is very similar to the circuit shown in FIG. 11 which is described in detail U.S. in U.S. Pat. No. 6,151,346 (hereby incorporated by reference). A single bank of capacitors define a charging $C_0$ capacitor bank 42. Electrical pulses are generated by the closing of switch $S_1$ 46 which consists of two IGBT switches mounted in parallel $L_0$ inductor 48 holds off current flow through $S_1$ so it can close without any deterioration to charge up $C_1$ capacitor bank 52. $L_1$ saturable inductor holds off substantial current flow through pulse transformer system 56 until capacitor $L_1$ saturates at which time the primary turns of fractional turn pulse transformer system 56 is pulsed with a short about 0.5 microsecond 1000 volt pulse. In this embodiment, transformer system 56 is comprised of two separate transformer units 56A and 56B which in this case are virtually identical.

Figure 5:
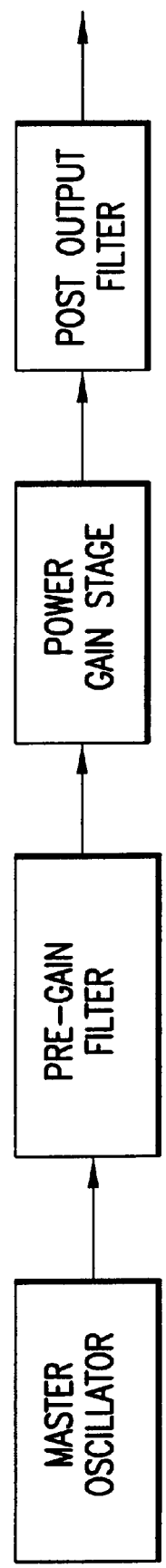

Each of the pulse transformer unit 56 is similar to the pulse transformer described in U.S. Pat. No. 6,151,346. The pulse transformer units of the present embodiment has only a single turn in the secondary winding and 23 induction units. The transformer as configured as an auto transformer as shown in FIG. 3B to provide a 1:24 step-up ratio. Each of the 23 induction units comprise an aluminum spool 56A having two flanges (each with a flat edge with threaded bolt holes) which are bolted to positive and negative terminals on printed circuit board 56B as shown along the bottom edge of FIG. 3A. (The negative terminals are the high voltage terminals of the twenty three primary windings.) Insulators 56C separates the positive terminal of each spool from the negative terminal of the adjacent spool. Between the flanges of the spool is a hollow cylinder 1¹¹⁄₁₆ inches long with a 0.875 OD with a wall thickness of about ¹⁄₃₂ inch. The spool is wrapped with one inch wide, 0.7 mil thick Metglas™ 2605 S3A and a 0.1 mil thick mylar film until the OD of the insulated Metglas™ wrapping is 2.24 inches. A prospective view of a single wrapped spool forming one primary winding is shown in FIG. 5 of U.S. Pat. No. 6,151,346.

Figure 3A:
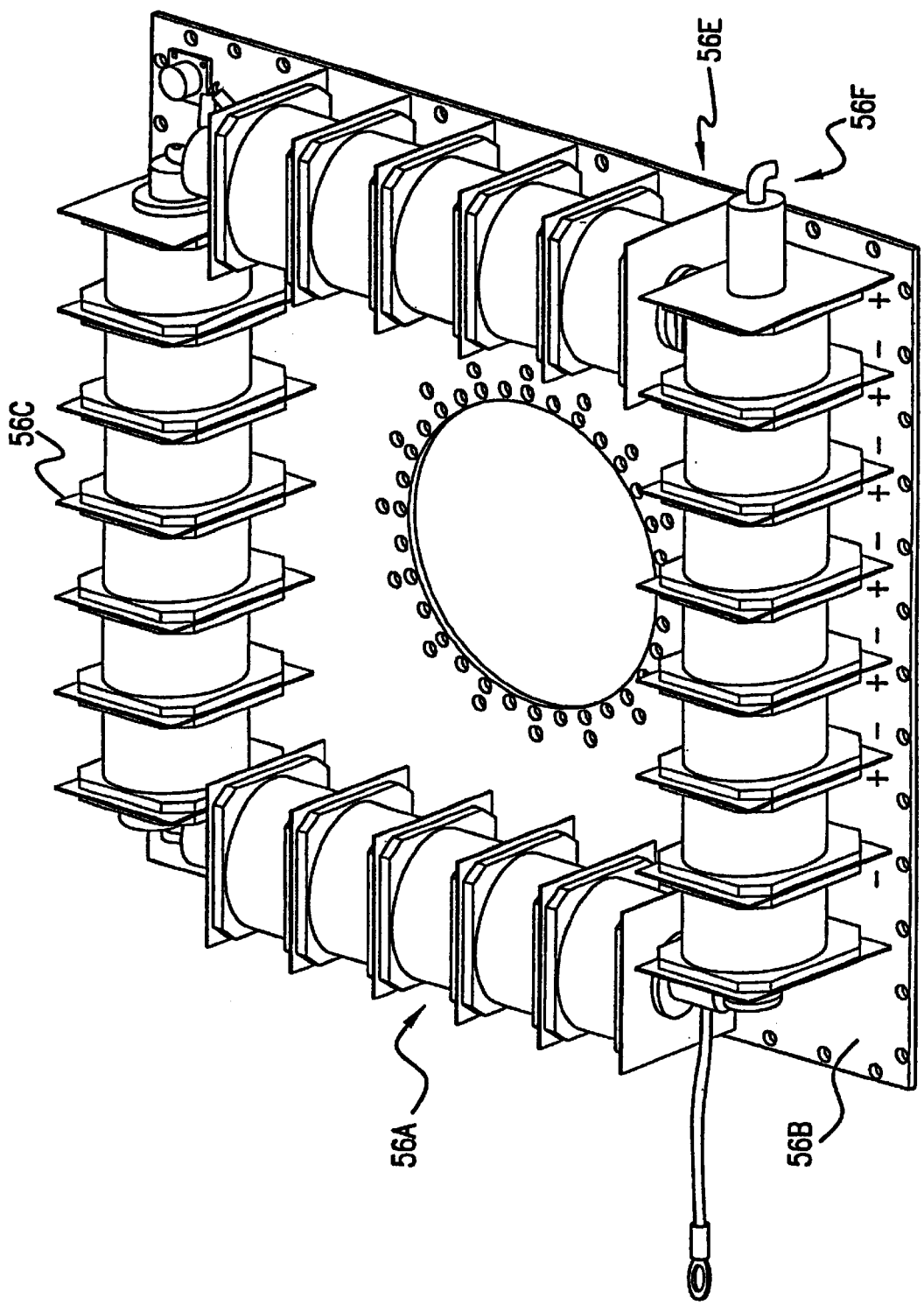
FIG. 3A is a drawing of a pulse transformer.

The secondary of each transformer is a single OD stainless steel rod mounted within a tight fitting insulating tube of Teflon® (PTFE). The transformer units are in four sections as shown in FIG. 3A. The low voltage end of stainless steel secondary shown as 56D in FIG. 3A is tied to the primary HV lead on printed circuit board 56B at 56E, the high voltage terminal is shown at 56F. As a result, the transformer assumes an auto-transformer configuration and the step-up ratio becomes 1:24 instead of 1:23. Thus, an approximately −1400 volt pulse between the + and − terminals of the induction units will produce an approximately −35,000 volt pulse at terminal 56F on the secondary side. A 1000 volt primary pulse produces a pulse on the secondary sides of both transformers of about 24,000 V. This single turn secondary winding design provides very low leakage inductance permitting extremely fast output rise time.

The general configuration of the pulse transformer system is shown in FIG. 3B. As indicated in this figure, the primary high voltage pulse of about 1000V produced by the upstream portion of the pulse power system arrives at each pulse transformer at exactly the same time and as the corresponding output pulse of each of the transformers will therefore be substantially identical in shape and time. Applicants estimate that the jitter at the output of the two transformer will be less than one nanosecond.

As indicated in FIG. 3 in this embodiment the portion of pulse power circuits downstream of the pulse transformers are separate but substantially equal so that the jitter at electrodes 83 and 84, A and B, is estimated to be less than 3 ns. Therefore, the gain medium in both lasers is produced at the same time with a variation of less than about 3 ns. The duration of each of the pulses is about 20 to 50 ns so that the laser pulse produced in the first laser is properly amplified in the second laser. Preferably, the circuit is provided with a bias circuit to bias all saturable inductors so that they are reverse conducting prior to each pulse. The bias circuit is designed so that during a short period immediately after the pulse the saturable inductors remain forward conducting so that pulse energy reflected from the electrodes can be recovered as explained in detail in U.S. Pat. No. 5,729,562.

In preferred embodiments of this invention, the output coupler of the first laser is located about one foot downstream of the input window of the second laser. Therefore, for this reason or for other reasons, it may be desirable to delay the discharge of the second laser as compared to the first laser. Since the electrical pulse travels through a good conductor at a rate of about 1ns/20 cm, this can easily be accomplished by making a conductor carrying the pulse of the second laser longer (for example, by 20 to 40 cm) than a corresponding conductor for the first laser.

Adjustable Delays

Figure 3C:
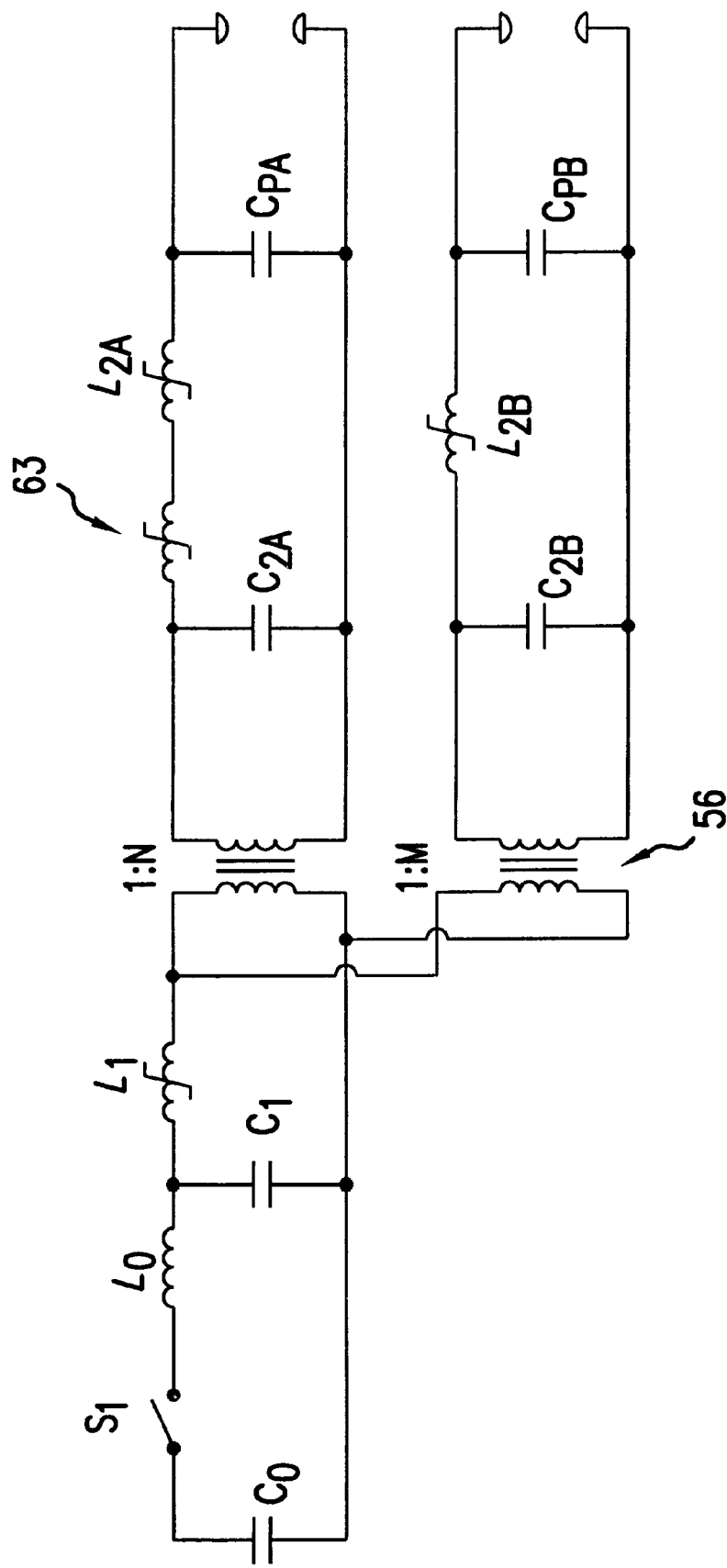
FIG. 3C is a modification of the FIG. 3 circuit providing an adjustable delay.
Figures 1, 3C:
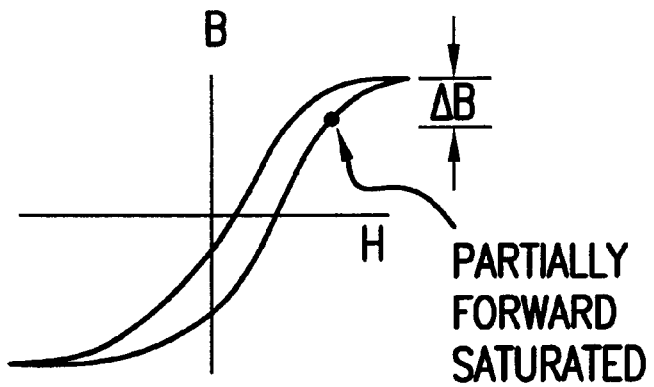
Figure 3D:
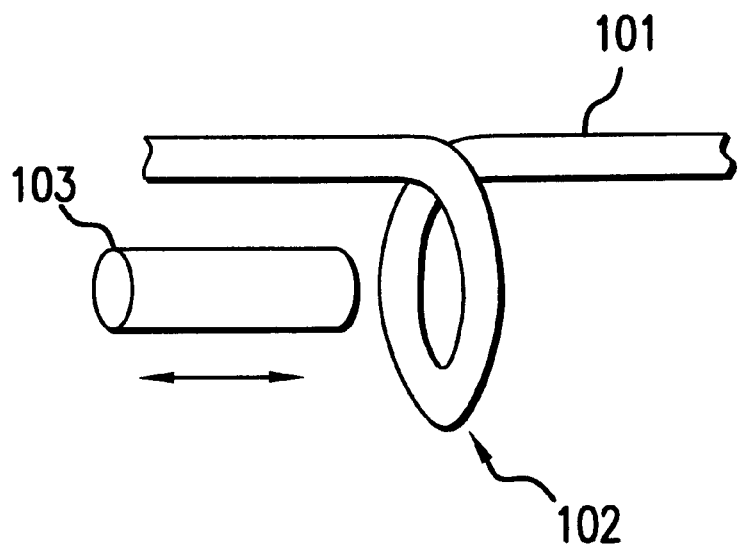
FIG. 3D shows an alternate filter adjustment technique.

Another approach to control the timing of the discharge in one laser relative to the other is to insert a saturable inductor in the circuit shown in FIG. 3 in one of the branches downstream of transformer 56 such as at location 63 shown in FIG. 3C. This saturable inductor is fitted with an adjustable forward bias. The forward bias which is applied is chosen so that the time to complete the forward saturation of the inductor is approximately equal to the desired delay time. The delay time is a function of the number of turns in the saturable inductor, the cross-section of its magnetic core and magnetic flux swing ΔB of the inductor. Since the required delay is very small the number of turns can be one and the core can be small (such as 2 inch diameter) and the flux swing ΔB can also be small as indicated in FIG. 3C2. By adjusting the bias the relative delay can be adjusted. The delay control could be incorporated into a feedback loop design to control jitter. Since the delay expected to be required for an oscillator/amplifier configuration is small (on the order of ns or 10's of ns), the delay reactor can be made small. In addition, the core material can be selected to minimize the losses introduced in the circuit, again since the volt-second requirement is likely to be much smaller than that required in the power pulse compression circuit. Another technique for providing for an adjustable delay is shown in FIG. 3D. In this case, a conductor 101 carrying the pulse to one of the lasers is arranged in a single loop coil 102 and a rod 103 having high permeability arranged to be movable into and out of the coil. The rod can be positioned with a fast drive such as a stepper motor or a piezoelectric driver.

Figure 3E:
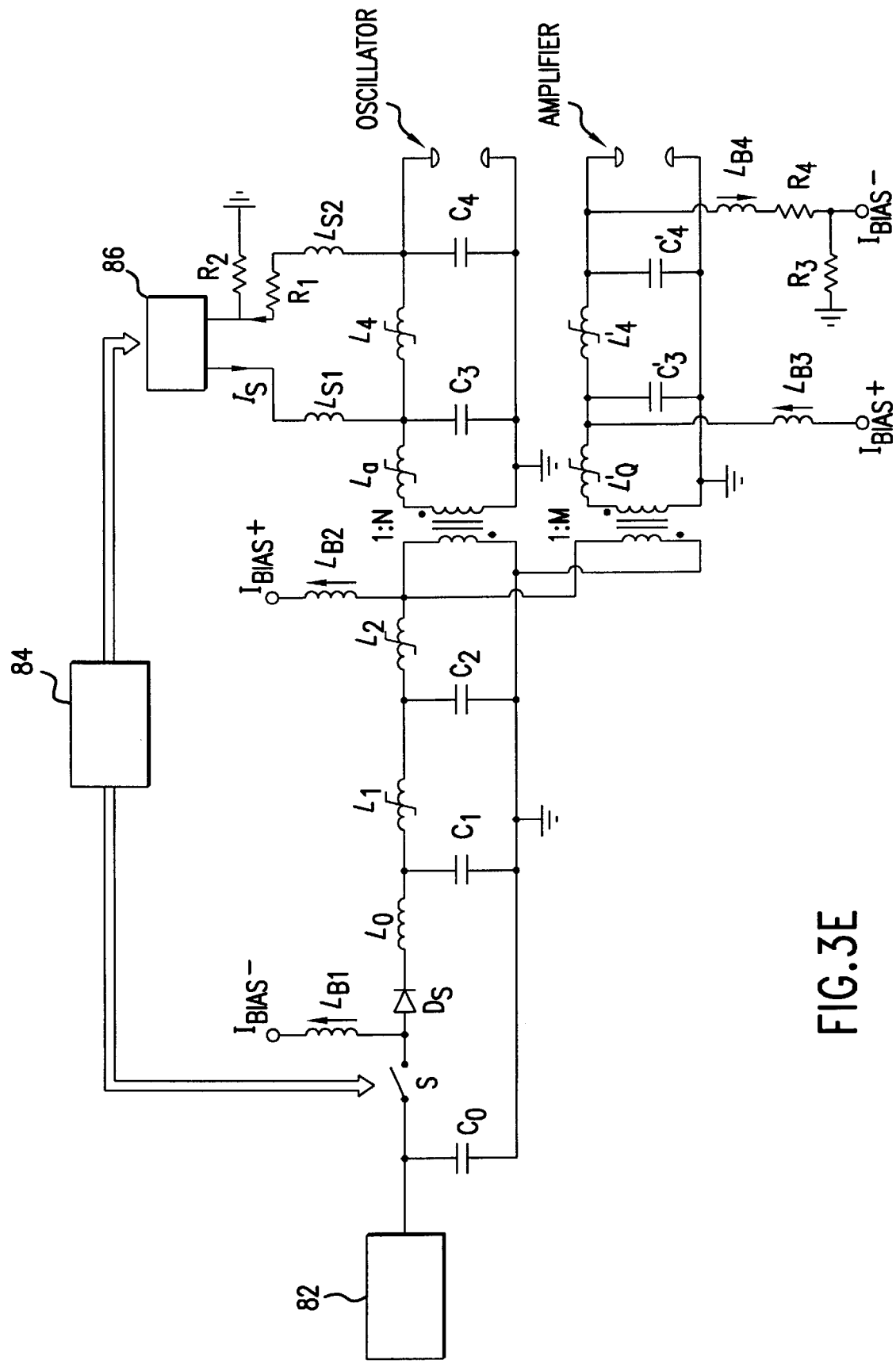
FIG. 3E shows a circuit providing adjustable delays.
Figure 3F:
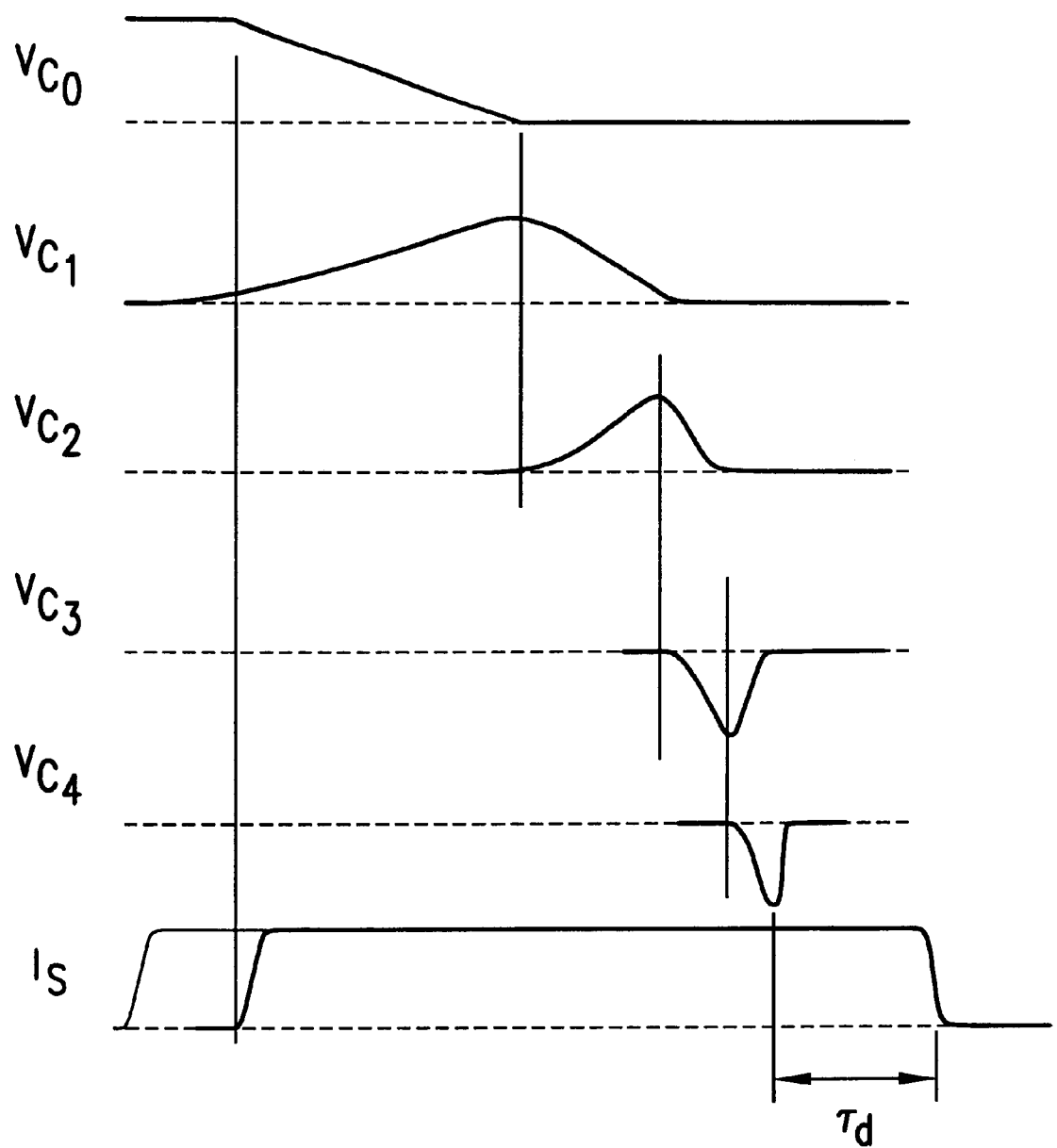
FIG. 3F shows pulse timing sequences.
Figure 4:
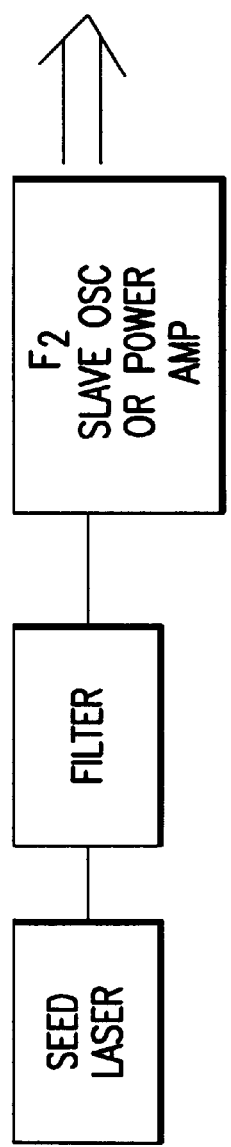
FIGS. 4 and 5 are black diagrams of $F_2$ laser systems.

Still another way of providing an adjustable delay is shown in FIG. 3E. In this technique, pulsed current source 86 is used to provide a secondary pulse current for inductor $L_4$. This current source 86 is triggered by a trigger circuit 86, which also closes the switches. As shown in FIG. 3F current pulse $I_s$ starts at about the same time as switch S closes and lasts a time td after the main compressed current pulse propagates to capacitors $C_4$ and $C_4'$. $t_d$ can be about 10 us. The secondary pulsed current serves to provide a saturation for inductor $L_4$. By changing this current, a saturation point on BH curve of inductor $L_4$ can be changed, causing the delay to change as well. The corresponding inductor in the amplified circuit, $L_4$ is baised with a non-adjustable bias current $I_{bias}$. Other embodiments of this technique are also possible, such as providing two pulsed current sources for inductors $L_4$ and $L_4'$.

Other Pulse Transformer Configurations

Many variations of the pulse transformers configuration shown in FIG. 3B are possible. The preferred output voltage for the two laser systems may not be the same. If different voltages are needed this can be easily accomplished by providing a smaller or larger number of induction units for one of the transformers relative to the other one. Also, switches could be included in one of the transformers to cut out some of the induction units to reduce the discharge voltage output of that transformer relative to the other one. Taps could be provided between any of the four transformer sections of either transformer to take off the secondary voltage at reduced levels.

CONTROLLING THE CENTERLINE WAVELENGTH

Applicants have done extensive testing to explore techniques for centerline wavelength control of $F_2$ lasers systems as described above. Applicants have determined that in a master oscillator, power amplifier configuration where the seed beam is in the range of 20 μJ to 50 μJ or greater the center wavelength and the band width of the seed beam determines almost exactly the center wavelength and band width of the output beam. Applicants have also measured precisely the effects on center wavelength and band width of laser gas pressure, buffer gas mix, $F_2$ partial pressure, laser gas temperature, discharge voltage and pulse energy. Applicants then use these results to control the center wavelength by varying one or more of the above parameters. The degree of parameter charge necessary to make the centerline wavelength is indicated by the pressure shift coefficients shown above and in the figures.

Applicants believe that the total laser gas pressure will be the more easily used parameter to control centerline wavelength, but the other parameters could be used or a combination of more than one parameter could be used.

Although the present invention has been described in terms of specific embodiments, the reader should understand that the scope of the invention is to be delimited by the appended claims and their legal equivalents.

We claim:

1. An injection seeded narrow band gas discharge pulse laser system comprising:
   A) a first discharge laser subsystem comprising:
      1) a first laser chamber containing a laser gas, and a first set of electrodes defining a first discharge region in which electric discharges produce a gain medium in said laser gas for producing a first laser beam having a bandwidth, and
      2) a line narrowing device for reducing the bandwidth of said first laser beam to produce a narrow band first laser subsystem output beam;
   B) a second discharge laser subsystem comprising:
      a second laser chamber containing a circulating laser gas and a second set of electrodes defining a second discharge region in which electric discharges produce a gain medium for amplifying said first laser subsystem output beam; and
   C) a centerline wavelength control means for controlling the centerline wavelength of output beams of said laser system,
   D) a pulse power system comprising:
      1) a pulse transformer system comprising:
         a) a first pulse transformer comprising:
            i) a first plurality of transformer cores defining a number of cores N, each core having a primary winding,
            ii) at least one first secondary conductor, passing through all of said first plurality of cores,
         b) a second pulse transformer comprising:
            i) a second plurality of cores defining a number of cores M, each core having a primary winding;
            ii) at least one second secondary conductor, passing through all of said second plurality of cores,
      2) a high voltage pulse power source for producing high voltage electric pulses of relatively long duration,
      3) an upstream electrical pulse compression circuit for compressing said high voltage electrical pulses to produce compressed high voltage pulses of relatively short duration, said upstream circuit applying said compressed high voltage pulses in parallel:
         a) to said primary winding of each of said first plurality of transformer cores and
         b) to said primary winding of each of said second plurality of transformer cores,
            to produce very high voltage first pulses at an output on said first secondary conductor and to produce very high voltage second pulses at an output on said second secondary conductor,
      4) a first downstream electrical circuit for applying said first very high voltage pulses to said first set of electrodes to create discharges in said first discharge region, and
      5) a second downstream electrical circuit for applying said second very high voltage pulses said second set of electrodes to pulse to create discharges in said second discharge region,
   wherein said first discharge laser subsystem output beam is amplified in said second discharge region to produce an amplified laser beam at an output of said second discharge laser subsystem.

2. A laser system as in claim 1 wherein N is equal to M.

3. A laser system as in claim 1 wherein N is not equal to M.

4. A laser system as in claim 1 wherein N and M are each approximately equal to 23.

5. A laser system as in claim 1 wherein said at least one first secondary conductor is a single conductor and said at least one second secondary conductor is a single conductor.

6. A laser system as in claim 1 wherein said at least one first secondary conductor is a plurality of coaxial conductors and said at least one secondary conductor is a plurality of coaxial conductors.

7. A laser system as in claim 1 and further comprising a pulse delay means for delaying one of said very high voltage first pulses and very high voltage second pulses with respect to the other.

8. A laser system as in claim 7 wherein said pulse delay means comprises an elongation of a conduction path.

9. A laser system as in claim 7 wherein said delay means comprises an adjustable bias on a saturable indicator.

10. A laser as in claim 1 and further comprising a saturable inductor filtered with an adjustable forward bias.

11. A laser as in claim 1 and further comprising means for detecting jitter and a jitter control feedback loop.

* * * * *